United States Patent
Jang et al.

(10) Patent No.: US 11,018,685 B2
(45) Date of Patent: May 25, 2021

(54) ANALOG-TO-DIGITAL CONVERTER AND METHOD OF PERFORMING ANALOG-TO-DIGITAL CONVERSION

(71) Applicant: SAMSUNG ELECTRONICS CO., LTD., Suwon-si (KR)

(72) Inventors: Woo Jin Jang, Hwaseong-si (KR); Yong Lim, Seoul (KR); Seung Hyun Oh, Seoul (KR); Jae Hoon Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/931,729

(22) Filed: May 14, 2020

(65) Prior Publication Data
US 2021/0091782 A1    Mar. 25, 2021

(30) Foreign Application Priority Data

Sep. 19, 2019  (KR) .......................... 10-2019-0115468

(51) Int. Cl.
*H03M 1/38*  (2006.01)
*H03M 1/46*  (2006.01)
(Continued)

(52) U.S. Cl.
CPC ............ *H03M 1/466* (2013.01); *H03K 5/249* (2013.01); *H03M 1/00* (2013.01); *H03M 1/06* (2013.01); *H03M 1/1009* (2013.01); *H03M 1/12* (2013.01)

(58) Field of Classification Search
CPC ........ H03M 1/00; H03M 1/12; H03M 1/1009; H03M 1/06
(Continued)

(56) References Cited

U.S. PATENT DOCUMENTS 8,362,934 B2    1/2013  Matsuzawa et al.
8,487,659 B2    1/2013  Kapusta
(Continued)

FOREIGN PATENT DOCUMENTS

JP    2008-205877    9/2008

OTHER PUBLICATIONS

Harpe et al., "A 7-to-10b 0-to-4MS/s Flexible SAR ADC with 6.5-to-16fJ/conversion-step", 2012 IEEE International Solid-State Circuits Conference.
(Continued)

*Primary Examiner* — Joseph J Lauture
(74) *Attorney, Agent, or Firm* — F. Chau & Associates, LLC

(57) ABSTRACT

An analog-to-digital converter includes a comparator configured to compare an input signal with a reference signal and to output a comparison signal indicating a corresponding comparison result, a control logic configured to output a control signal for adjusting the reference signal based on the comparison signal, and a reference signal adjusting circuit configured to adjust the reference signal based on the control signal. The comparator includes a first pre-amplifier configured to amplify a difference between the input signal and the reference signal using a first transistor having a first size, a second pre-amplifier configured to amplify the difference between the input signal and the reference signal using a second transistor having a second size different from the first size, and a latch configured to generate the comparison signal using at least one of an output of the first and second pre-amplifiers. The first and second pre-amplifiers share the latch.

20 Claims, 21 Drawing Sheets

(51) Int. Cl.
*H03K 5/24* (2006.01)
*H03M 1/00* (2006.01)
*H03M 1/12* (2006.01)
*H03M 1/06* (2006.01)
*H03M 1/10* (2006.01)

(58) Field of Classification Search
USPC .................. 341/161, 155, 120, 118, 126
See application file for complete search history.

(56) References Cited

U.S. PATENT DOCUMENTS

| | | |
|---|---|---|
| 8,674,861 B2 | 3/2014 | Matsuno et al. |
| 8,957,706 B2 | 2/2015 | Chen |
| 9,432,049 B2 | 8/2016 | Katayama et al. |
| 9,882,577 B2 | 1/2018 | Dedic et al. |
| 2012/0119063 A1* | 5/2012 | Takamiya ............... H04N 5/374 250/208.1 |

OTHER PUBLICATIONS

Kang et al., "A 12b 11 MS/s Successive Approximation ADC with two comparators in 0.13 μm CMOS", 2009 Symposium on VLSI Circuits Digest of Technical Papers.
Schinkel et al., "A Double-Tail Latch-Type Voltage Sense Amplifier with 18ps Set-up+Hold Time", 2007 IEEE International Solid-State Circuits Conference.

* cited by examiner

| Period | T1 | T2 | T3 | ... | Tn | T(n+1) | ... |
|---|---|---|---|---|---|---|---|
| Compare Signal | CS1 | CS2 | CS3 | ... | CSn | CS(n+1) | ... |
| Bit Value | B1 | B2 | B3 | ... | Bn | B(n+1) | ... |
| RS Control Signal | RCON1 | RCON2 | RCON3 | ... | RCONn | RCON(n+1) | ... |

ANALOG-TO-DIGITAL CONVERTER AND METHOD OF PERFORMING ANALOG-TO-DIGITAL CONVERSION

CROSS-REFERENCE TO RELATED APPLICATIONS

This application claims priority under 35 U.S.C. § 119 to Korean Patent Application No. 10-2019-0115468 filed on Sep. 19, 2019, the disclosure of which is incorporated by reference herein in its entirety.

TECHNICAL FIELD

Exemplary embodiments of the present invention relate to an analog-to-digital converter, and a method of performing analog-to-digital conversion using the analog-to-digital converter.

DISCUSSION OF THE RELATED ART

An analog-to-digital converter (ADC) is used to generate a sequence of digital codes that indicate each signal level of an analog signal.

One type of analog-to-digital converter is a successive approximation register analog-to-digital converter (SAR ADC) that repeatedly performs analog-to-digital conversion, compares the data, and determines the bits of the digital code.

Since a lot of electric power is consumed in the process of converting a signal by such an analog-to-digital converter, research for reducing the consumption of the electric power is being conducted.

SUMMARY

Aspects of the present invention provide an analog-to-digital converter with reduced operating electric power consumption.

Aspects of the present invention also provide a method for performing analog-to-digital conversion using the analog-to-digital converter with reduced operating electric power consumption.

According to an exemplary embodiment, an analog-to-digital converter includes a comparator configured to compare an input signal with a reference signal and to output a comparison signal indicating a corresponding comparison result, a control logic configured to output a control signal for adjusting the reference signal based on the comparison signal, and a reference signal adjusting circuit configured to adjust the reference signal based on the control signal. The comparator includes a first pre-amplifier configured to amplify a difference between the input signal and the reference signal using a first transistor having a first size, a second pre-amplifier configured to amplify the difference between the input signal and the reference signal using a second transistor having a second size different from the first size, and a latch configured to generate the comparison signal using at least one of an output of the first pre-amplifier and an output of the second pre-amplifier. The first pre-amplifier and the second pre-amplifier share the latch.

According to an exemplary embodiment, an analog-to-digital converter includes a comparator configured to compare an input signal with a reference signal and to output a first comparison signal and a second comparison signal indicating a corresponding comparison result, and a control logic configured to determine a first bit value based on the first comparison signal, a second bit value based on the second comparison signal, and a third bit value corresponding to the input signal based on the first bit value and the second bit value. The comparator includes a first pre-amplifier configured to amplify a difference between the input signal and the reference signal, a second pre-amplifier configured to amplify the difference between the input signal and the reference signal, and a latch configured to generate the first and second comparison signals using at least one of an output of the first pre-amplifier and an output of the second pre-amplifier. A size of the first pre-amplifier and a size of the second pre-amplifier are different from each other. The control logic controls the first and second pre-amplifiers such that the first comparison signal is generated using the first pre-amplifier, and the second comparison signal is generated using the second pre-amplifier.

According to an exemplary embodiment, an analog-to-digital converter includes a comparator configured to compare an input signal with a reference signal and to output a comparison signal indicating a corresponding comparison result, a control logic configured to output a control signal for adjusting the reference signal based on the comparison signal and to determine a digital signal corresponding to the input signal based on the comparison signal, and a reference signal adjusting circuit configured to adjust the reference signal based on the control signal. The comparator includes a first pre-amplifier configured to amplify a difference between the input signal and the reference signal using a first transistor having a first size, a second pre-amplifier configured to amplify the difference between the input signal and the reference signal using a second transistor having a second size different from the first size, and a latch configured to generate the comparison signal using at least one of an output of the first pre-amplifier and an output of the second pre-amplifier. The latch includes a first reset circuit configured to receive the output of the first pre-amplifier and reset first and second output nodes using a third transistor having a third size, a second reset circuit configured to receive the output of the second pre-amplifier and reset the first and second output nodes using a fourth transistor having a fourth size different from the third size, and an amplifier circuit configured to amplify voltage levels of the first and second output nodes using at least one of the output of the first pre-amplifier and the output of the second pre-amplifier.

According to an exemplary embodiment, a method of performing analog-to-digital conversion using an analog-to-digital converter includes outputting a first comparison signal by comparing an input signal with a first reference signal using a first pre-amplifier comprising a transistor having a first size, determining a first bit value based on the first comparison signal, outputting a second comparison signal by comparing the input signal with a second reference signal using a second pre-amplifier comprising a transistor having a second size different from the first size, determining a second bit value based on the second comparison signal, and determining a third bit value corresponding to the input signal by performing a predetermined operation on the first bit value and the second bit value.

BRIEF DESCRIPTION OF THE DRAWINGS

The above and other features of the present invention will become more apparent by describing in detail exemplary embodiments thereof with reference to the accompanying drawings, in which.

DETAILED DESCRIPTION OF THE EXEMPLARY EMBODIMENTS

Figure 1:
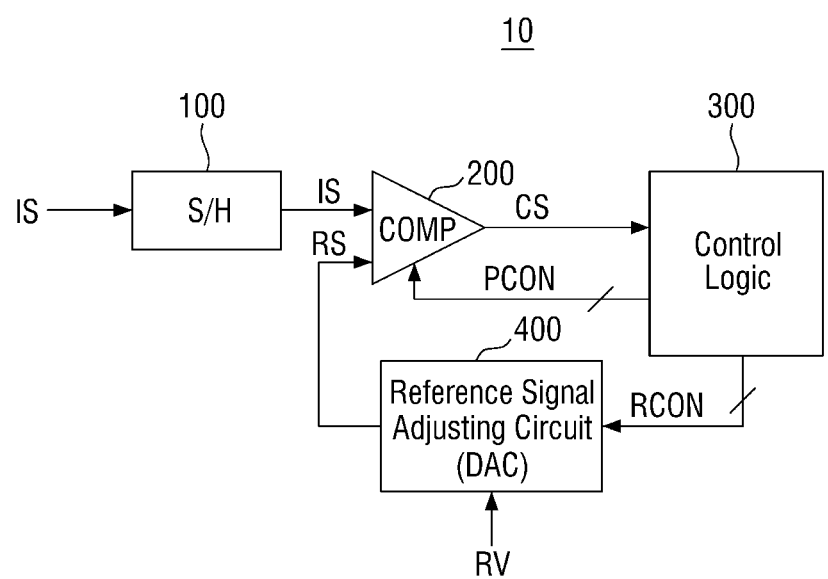
FIG. 1 is a block diagram of a semiconductor device according to exemplary embodiments.

Exemplary embodiments of the present invention will be described more fully hereinafter with reference to the accompanying drawings. Like reference numerals may refer to like elements throughout the accompanying drawings.

It will be understood that the terms "first," "second," "third," etc. are used herein to distinguish one element from another, and the elements are not limited by these terms. Thus, a "first" element in an exemplary embodiment may be described as a "second" element in another exemplary embodiment.

It should be further understood that descriptions of features or aspects within each exemplary embodiment should typically be considered as available for other similar features or aspects in other exemplary embodiments, unless the context clearly indicates otherwise.

As used herein, the singular forms "a", "an" and "the" are intended to include the plural forms as well, unless the context clearly indicates otherwise.

FIG. 1 is a block diagram of a semiconductor device according to exemplary embodiments.

Referring to FIG. 1, the semiconductor device may include a sample circuit 100, a comparator 200, a control logic 300, and a reference signal adjusting circuit 400.

In exemplary embodiments, the semiconductor device 10 may be, for example, an analog-to-digital converter that converts an analog input signal IS into a digital signal corresponding thereto. For example, the semiconductor device 10 may be a successive approximation register analog-to-digital converter (SAR ADC) that converts an analog input signal IS provided through a successive approximation type into a digital output signal of q bits (q is a natural number). An analog-to-digital converter may also be referred to herein as an analog-to-digital converter circuit.

Hereinafter, although the technical idea of the present invention will be described as an example in which the semiconductor device 10 is a SAR ADC, exemplary embodiments according to the technical idea of the present invention are not limited thereto. For example, in exemplary embodiments, the semiconductor device 10 may be implemented as other types of analog-to-digital converters other than SAR ADC, and may also be implemented as other types of semiconductor devices 10 other than the analog-to-digital converters.

Referring to FIG. 1, the sample circuit 100 receives the input signal IS and may sample and hold the input signal. For example, the sample circuit 100 may store the input signal IS using a predetermined storage element so that the input signal IS may be provided to the comparator 200. Thus, the sample circuit 100 may provide the sampled input signal IS to the comparator 200.

The comparator 200 compares the input signal IS with a reference signal RS, and may output a comparison signal CS on the basis of the result thereof. For example, the comparator 200 may compare a voltage level of the input signal IS with a voltage level of the reference signal RS, and output the comparison signal CS on the basis of the result thereof. For example, the comparison signal CS may indicate a corresponding comparison result based on the comparison between the input signal IS and the reference signal RS.

If a voltage level of the input signal IS is greater than a voltage level of the reference signal RS, the comparator 200 may output a comparison signal CS having a first level, and if the voltage level of the input signal IS is smaller than the voltage level of the reference signal RS, the comparator 200 may output a comparison signal CS having a second level different from the first level. The detailed configuration of the comparator 200 will be described more fully below.

The control logic 300 may receive the comparison signal CS from the comparator 200, and determine a bit value of the digital signal corresponding to the input signal IS on the basis of the comparison signal CS. In addition, the control logic 300 may output a first control signal RCON to the reference signal adjusting circuit 400 on the basis of the comparison signal CS. In an exemplary embodiment, the reference signal adjusting circuit 400 may generate the first control signal RCON based on multiple generated comparison signals, which are described further below. The control logic 300 may also be referred to herein as a control logic circuit.

The reference signal adjusting circuit 400 may adjust the reference signal RS to be provided to the comparator 200 in accordance with the first control signal RCON provided from the control logic 300. For example, the reference signal adjusting circuit 400 may adjust the voltage level of the reference signal RS to be provided to the comparator 200 in accordance with the first control signal RCON provided from the control logic 300.

In exemplary embodiments, if the semiconductor device 10 is a SAR ADC, the reference signal adjusting circuit 400 may include a digital-to-analog converter DAC that adjusts the voltage level of the reference signal RS in accordance with the first control signal RCON, which is a digital signal. For example, when the semiconductor device 10 is a SAR ADC, the reference signal adjusting circuit 400 may include a digital-to-analog converter DAC that adjusts the reference voltage RV provided from the outside in accordance with the first control signal RCON and outputs the reference voltage as a reference signal RS. For example, if the semiconductor device 10 is a SAR ADC, the reference signal adjusting circuit 400 may include a digital-to-analog converter DAC that controls a plurality of capacitors and a plurality of switches disposed therein in accordance with the first control signal RCON to generate the reference signal RS from the reference voltage RV, and outputs the reference signal RS to the comparator 200.

On the other hand, the control logic 300 may provide the comparator 200 with a second control signal PCON for controlling the operation of the comparator 200. A further description of the second control signal PCON will be provided below.

In exemplary embodiments, although the control logic 300 may include a SAR logic, and the reference signal adjusting circuit 400 may include a digital-to-analog converter which generates the reference voltage in accordance with the digital first control signal RCON provided from the SAR logic. However, exemplary embodiments are not limited thereto.

Figure 2:
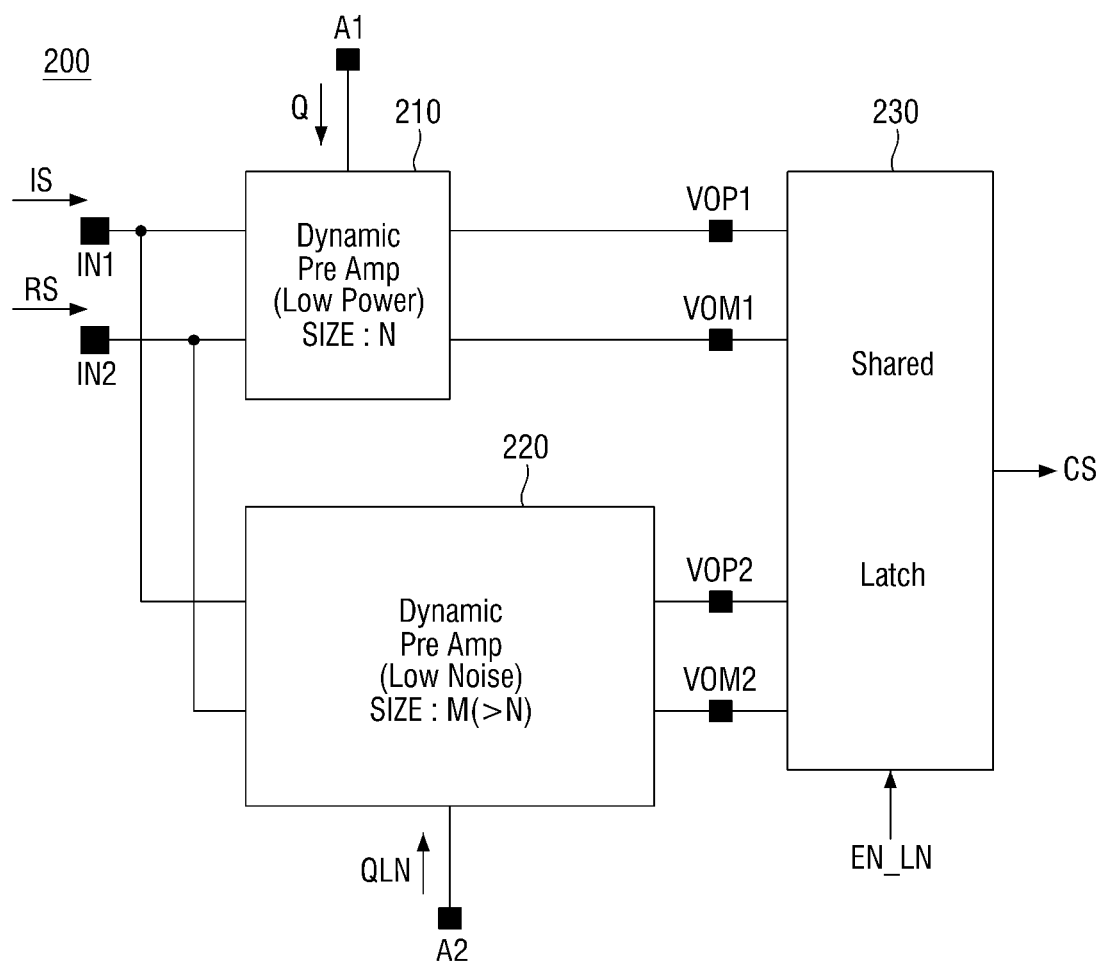
FIG. 2 is an exemplary block diagram of a comparator of FIG. 1.

FIG. 2 is an exemplary block diagram of the comparator of FIG. 1.

Referring to FIG. 2, the comparator 200 may include a first pre-amplifier 210, a second pre-amplifier 220, and a shared latch 230.

The first pre-amplifier 210 and the second pre-amplifier 220 may receive the input signal IS and the reference signal RS. For example, the first pre-amplifier 210 and the second pre-amplifier 220 may receive the input signal IS through an input node IN1 and may receive the reference signal RS through an input node IN2.

The first pre-amplifier 210 and the second pre-amplifier 220 may be connected to the shared latch 230. That is, the outputs of the first pre-amplifier 210 and the second pre-amplifier 220 may be transmitted to the shared latch 230.

In an exemplary embodiment, the first pre-amplifier 210 and the second pre-amplifier 220 may share a latch for generating the comparison signal CS. For example, both in the case of using the first pre-amplifier 210 and in the case of using the second pre-amplifier 220 to generate the comparison signal CS, the comparator 200 may generate the comparison signal CS using the shared latch 230 rather than another separate latch (e.g., separate first and second latches). Therefore, the size of the comparator 200 may be reduced as compared with the case of using another separate latch.

The first pre-amplifier 210 and the second pre-amplifier 220 may have different sizes from each other. For example, if the first pre-amplifier 210 has a first size N, the second pre-amplifier 220 may have a second size M that is larger than the first size N, in which M and N are natural numbers. In exemplary embodiments, the sizes of the transistors constituting the first pre-amplifier 210 and the second pre-amplifier 220 may be different from each other. Accordingly, the first pre-amplifier 210 and the second pre-amplifier 220 may have different sizes from each other. Also, in exemplary embodiments, the number of transistors constituting the first pre-amplifier 210 and the second pre-amplifier 220 may be different from each other.

Accordingly, the first pre-amplifier 210 and the second pre-amplifier 220 may have different sizes from each other. However, exemplary embodiments are not limited thereto, and a configuration in which the first pre-amplifier 210 and the second pre-amplifier 220 have different sizes from each other may be implemented with various modifications.

Since the first pre-amplifier 210 has a size that is relatively smaller than that of the second pre-amplifier 220, the magnitude of the current flowing in the first pre-amplifier 210 may be relatively small when the difference between the input signal IS and the reference signal RS is amplified. Therefore, the electric power consumption required for amplification in the first pre-amplifier 210 may be smaller than the electric power consumption required for amplification in the second pre-amplifier 220. That is, when the first pre-amplifier 210 operates, the comparator 200 may operate in a low power mode.

On the other hand, in the case of the first pre-amplifier 210, when the difference between the input signal IS and the reference signal RS is amplified, the magnitude of the current flowing in the pre-amplifier is relatively small as compared to the second pre-amplifier 220. Thus, the magnitude of amplification by which the first pre-amplifier 210 amplifies the difference between the input signal IS and the reference signal RS may be smaller than that of the second pre-amplifier 220. Therefore, in a case of generating the comparison signal CS using the second pre-amplifier 220, the comparison accuracy can be further improved compared to a case of generating the comparison signal CS using the first pre-amplifier 210. That is, when the second pre-amplifier 220 operates, the comparator 200 may operate in a low noise mode. Because of such characteristics, the first pre-amplifier 210 has characteristics that are relatively suitable for coarse comparison, and the second pre-amplifier 220 may have characteristics that are relatively suitable for fine comparison. However, exemplary embodiments are not limited thereto.

In an exemplary embodiment, the first pre-amplifier 210 may amplify the difference between the input signal IS and the reference signal RS before the second pre-amplifier 220 amplifies the difference between the input signal IS and the reference signal RS.

A first clock signal Q may be provided to the first pre-amplifier 210. Accordingly, the first pre-amplifier 210 may operate in synchronization with the first clock signal Q.

A second clock signal QLN may be provided to the second pre-amplifier 220. Thus, the second pre-amplifier 220 may operate in synchronization with the second clock signal QLN. The second clock signal QLN may determine whether the second pre-amplifier 220 is enabled. The second clock signal QLN may also be referred to as a control signal, and may be different from the first control signal RCON and the second control signal PCON. For example, in an exemplary embodiment, when the signal level of the second clock signal QLN does not change, the second pre-amplifier 220 does not amplify the difference between the input signal IS and the reference signal RS. Therefore, the second clock signal QLN may be used as an enable signal for determining whether the second pre-amplifier 220 is enabled.

A first enable signal EN_LN may be provided to the shared latch 230. The first enable signal EN_LN may determine whether the shared latch 230 is enabled. For example, the first enable signal EN_LN may determine whether a specific circuit area of the shared latch 230 is enabled. This will be described in more detail below.

In exemplary embodiments, the second control signal (PCON of FIG. 1) generated by the control logic (300 of FIG. 1) may include the first clock signal Q, the second clock signal QLN, and the first enable signal EN_LN. That is, the control logic (300 of FIG. 1) may generate the second clock signal QLN to be provided to the second pre-amplifier 220 and the first enable signal EN_LN to be provided to the shared latch 230, and may output these signals.

On the other hand, in exemplary embodiments, the second control signal (PCON of FIG. 1) generated by the control logic (300 of FIG. 1) may include only the first enable signal EN_LN. That is, the control logic (300 of FIG. 1) may generate and output the first enable signal EN_LN to be provided to the shared latch 230, and the second clock signal QLN to be provided to the second pre-amplifier 220 may also be generated by another device, using the first clock signal Q.

Hereinafter, exemplary configurations of the first pre-amplifier 210 and the second pre-amplifier 220 will be described more specifically with reference to FIG. 3.

Figure 3:
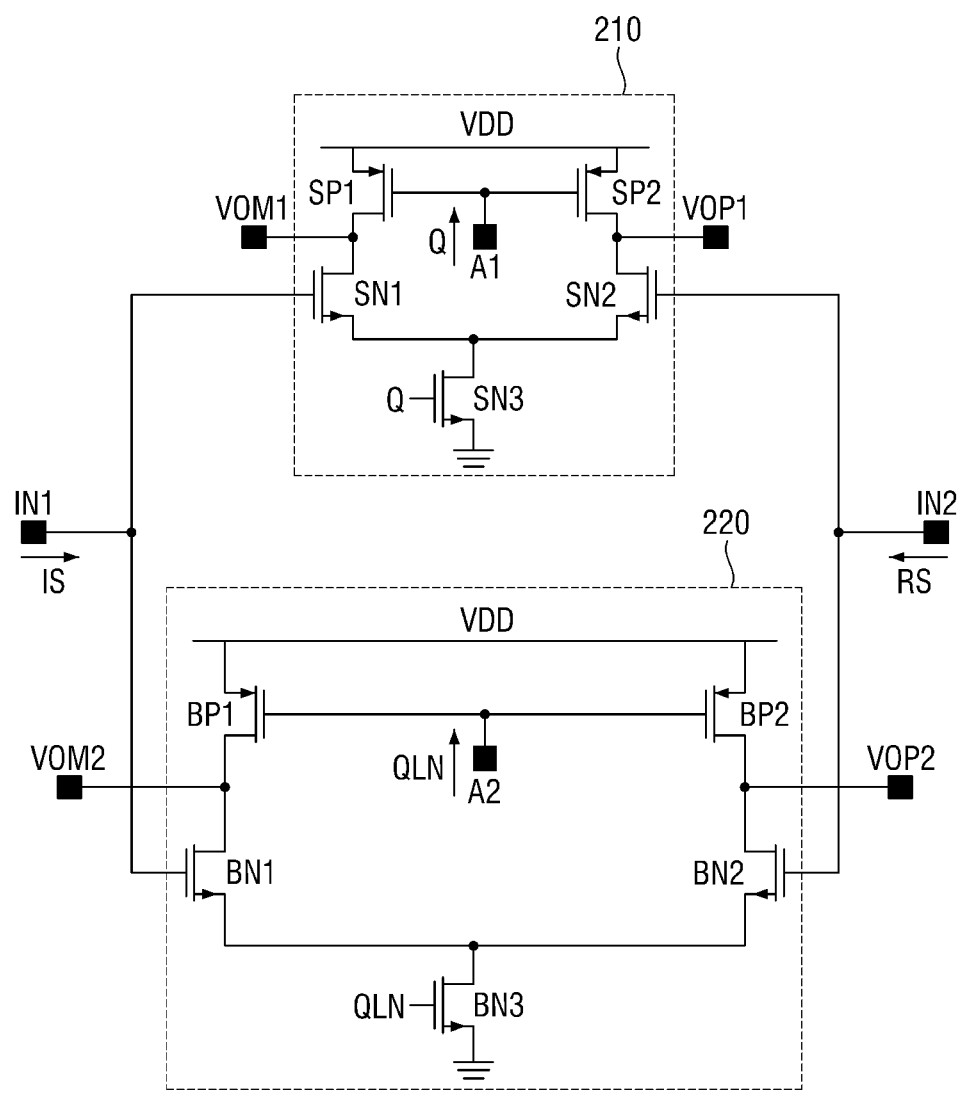
FIG. 3 is an exemplary circuit diagram of first and second pre-amplifiers of FIG. 2.

FIG. 3 is an exemplary circuit diagram of the first and second pre-amplifiers of FIG. 2.

Referring to FIG. 3, the first pre-amplifier 210 may include a plurality of transistors SP1, SP2, SN1, SN2 and SN3.

The transistor SP1 is connected between a power supply voltage VDD and an output node VOM1, and may provide the power supply voltage VDD to the output node VOM1 on the basis of the first clock signal Q input to a node A1 connected to the gate of the transistor SP1. The transistor SP2 is connected between the power supply voltage VDD and the output node VOP1, and may provide the power supply voltage VDD to the output node VOP1 on the basis of the first clock signal Q input to the node A1 connected to the gate of the transistor SP2.

The transistor SN1 is connected between the transistor SP1 and the transistor SN3, and may connect the output node VOM1 to a drain of the transistor SN3 on the basis of the input signal IS provided through the input node IN1 connected to the gate of the transistor SN1. The transistor SN2 is connected between the transistor SP2 and the transistor SN3 and may connect the output node VOP1 to the drain of the transistor SN3 on the basis of the reference signal RS provided through the input node IN2 connected to the gate of the transistor SN2. The transistor SN3 is connected between the transistors SN1 and SN2 and a ground voltage, and may ground the output node VOP1 and the output node VOM1 on the basis of the first clock signal Q provided to the gate of the transistor SN3.

Although the transistors SP1 and SP2 are constituted as, for example, P-type transistors, and the transistors SN1, SN2 and SN3 may be constituted as, for example, N-type transistors, exemplary embodiments are not limited thereto.

The second pre-amplifier 220 may include a plurality of transistors BP1, BP2, BN1, BN2 and BN3.

The transistor BP1 is connected between the power supply voltage VDD and the output node VOM2, and may provide the power supply voltage VDD to the output node VOM2, on the basis of the second clock signal QLN input to a node A2 connected to the gate of the transistor BP1. The transistor BP2 is connected between the power supply voltage VDD and the output node VOP2, and may provide the power supply voltage VDD to the output node VOP2, on the basis of the second clock signal QLN input to the node A2 connected to the gate of the transistor BP2.

The transistor BN1 is connected between the transistor BP1 and the transistor BN3, and may connect the output node VOM2 to the drain of the transistor BN3, on the basis of the input signal IS provided through the input node IN1 connected to the gate of the transistor BN1. The transistor BN2 is connected between the transistor BP2 and the transistor BN3, and may connect the output node VOP2 to the drain of the transistor BN3, on the basis of the reference signal RS provided through the input node IN2 connected to the gate of the transistor BN2. The transistor BN3 is connected between the transistors BN1 and BN2 and the ground voltage, gated to the second clock signal QLN provided to the gate of the transistor BN3, and may ground the output node VOM2 and the output node VOP2.

Although the transistors BP1 and BP2 may be configured as, for example, P-type transistors, and the transistors BN1, BN2 and BN3 may be configured as, for example, N-type transistors, exemplary embodiments are not limited thereto.

In exemplary embodiments, the sizes of the plurality of transistors SP1, SP2, SN1, SN2 and SN3 included in the first pre-amplifier 210 may be different from the sizes of the plurality of transistors BP1, BP2, BN1, BN2 and BN3 included in the second pre-amplifier 220.

For example, when each of the plurality of transistors SP1, SP2, SN1, SN2 and SN3 included in the first pre-amplifier 210 has a first size, each of the plurality of transistors BP1, BP2, BN1, BN2 and BN3 included in the second pre-amplifier 220 may have a second size greater than the first size. Therefore, the size of the second pre-amplifier 220 may be greater than the size of the first pre-amplifier 210.

Next, an exemplary configuration of the shared latch (230 of FIG. 2) will be described more fully with reference to FIG. 4.

Figure 4:
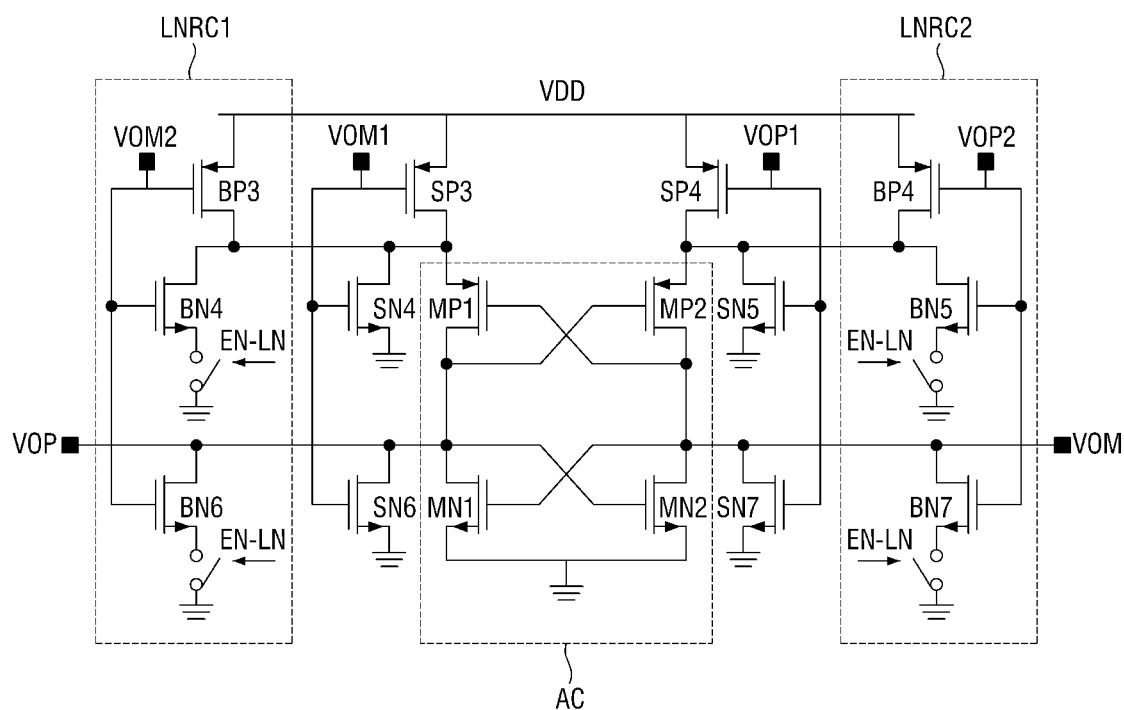
FIG. 4 is an exemplary circuit diagram of a shared latch of FIG. 2.

FIG. 4 is an exemplary circuit diagram of the shared latch of FIG. 2.

Referring to FIG. 4, the shared latch 230 may include low noise reset circuits LNRC1 and LNRC2 and an amplifier circuit AC. Transistors SP3, SP4, SN4, SN5, SN6 and SN7 may perform a function of the low power reset circuit.

The amplifier circuit AC may amplify a voltage level difference between the output nodes VOM and VOP. To this end, the amplifier circuit AC may include a plurality of transistors MP1, MP2, MN1 and MN2.

The transistor MP1 provides the power supply voltage VDD to the output node VOP on the basis of the voltage level of the output node VOM, and the transistor MP2 may provide the power supply voltage VDD to the output node VOM on the basis of the voltage level of the output node VOP.

The transistor MN1 grounds the output node VOP on the basis of the voltage level of the output node VOM, and the transistor MN2 grounds the output node VOM on the basis of the voltage level of the output node VOP.

When the first pre-amplifier (210 of FIG. 3) is enabled to operate or when the second pre-amplifier (220 of FIG. 3) is enabled to operate, the amplifier circuit AC may always operate to generate the comparison signal (CS of FIG. 2). That is, the first pre-amplifier (210 of FIG. 3) and the second pre-amplifier (220 of FIG. 3) may share the amplifier circuit AC.

The transistor SP3 may provide the power supply voltage VDD to the transistor MP1 on the basis of the voltage level of the output node VOM1 of the first pre-amplifier (210 of FIG. 3). The transistor SP4 may provide the power supply voltage VDD to the transistor MP2 on the basis of the voltage level of the output node VOP1 of the first pre-amplifier (210 of FIG. 3).

The transistor SN4 may provide a ground voltage to the transistor MP1 on the basis of the voltage level of the output node VOM1 of the first pre-amplifier (210 of FIG. 3). The transistor SN5 may provide a ground voltage to the transistor MP2 on the basis of the voltage level of the output node VOP1 of the first pre-amplifier (210 of FIG. 3).

The transistor SN6 may ground the output node VOP on the basis of the voltage level of the output node VOM1 of the first pre-amplifier (210 of FIG. 3). The transistor SN7 may ground the output node VOM on the basis of the voltage level of the output node VOP1 of the first pre-amplifier (210 of FIG. 3).

As previously mentioned, the transistors SP3, SP4, SN4, SN5, SN6 and SN7 may execute a function of a low power reset circuit that resets the output nodes VOM and VOP when the first pre-amplifier (210 of FIG. 3) is enabled to operate.

The low noise reset circuits LNRC1 and LNRC2 may execute a function of resetting the output nodes VOM and VOP when the second pre-amplifier (220 of FIG. 3) is enabled to operate.

To this end, the low noise reset circuits LNRC1 and LNRC2 may include a plurality of transistors BP3, BP4, BN4, BN5, BN6 and BN7.

The transistor BP3 may provide the power supply voltage VDD to the transistor MP1 on the basis of a voltage level of the output node VOM2 of the second pre-amplifier (220 of FIG. 3). The transistor BP4 may provide the power supply voltage VDD to the transistor MP2 on the basis of the voltage level of the output node VOP2 of the second pre-amplifier (220 of FIG. 3).

The transistor BN4 may provide a ground voltage to the transistor MP1 on the basis of the voltage level of the output node VOM2 of the second pre-amplifier (220 of FIG. 3). However, the transistor BN4 may provide the ground voltage to the transistor MP1 only in a state in which the switch is turned on by the first enable signal EN_LN.

The transistor BN5 may provide the ground voltage to the transistor MP2 on the basis of the voltage level of the output node VOP2 of the second pre-amplifier (220 of FIG. 3). However, the transistor BN5 may provide the ground voltage to the transistor MP2 only in a state in which the switch is turned on by the first enable signal EN_LN.

The transistor BN6 may ground the output node VOP on the basis of the voltage level of the output node VOM2 of the second pre-amplifier (220 of FIG. 3). However, the transistor BN6 may ground the output node VOP only in a state in which the switch is turned on by the first enable signal EN_LN.

The transistor BN7 may ground the output node VOM on the basis of the voltage level of the output node VOP2 of the second pre-amplifier (220 of FIG. 3). However, the transistor BN7 may ground the output node VOM only in a state in which the switch is turned on by the first enable signal EN_LN.

That is, in the state in which the switch is turned on by the first enable signal EN_LN, the transistors BN4 to BN7 execute the same functions as those of the transistors SN4 to SN7.

However, in the state in which the switch is turned off by the first enable signal EN_LN, the transistors BN4 to BN7 do not execute the same functions as those of the transistors SN4 to SN7. For example, in the state in which the switch is turned off by the first enable signal EN_LN, the transistors BN4 to BN7 are not involved in the increase or decrease of the voltage level of the output nodes VOM and VOP.

In exemplary embodiments, although the transistors SP3, SP4, BP3, BP4, MP1 and NP2 are constituted as, for example, P-type transistors, and the transistors SN4 to SN7, BN4 to BN7, MN1 and MN2 may be constituted as, for example, N-type transistors, exemplary embodiments are not limited thereto.

In exemplary embodiments, the plurality of transistors SP3 to SP4 and SN4 to SN7, and the plurality of transistors BP3 to BP4 and BN4 to BN7, may be different from each other in size.

For example, when each of the transistors SP3 to SP4 and SN4 to SN7 has a third size, each of the transistors BP3 to BP4 and BN4 to BN7 may have a fourth size greater than the third size.

In exemplary embodiments, the signal level of the comparison signal (CS of FIG. 2) may be determined on the basis of at least one of the voltage level of the output node VOP and the voltage level of the output node VOM. The operation of the semiconductor device according to exemplary embodiments will be described below with reference to FIGS. 5 to 13.

FIGS. 5 to 13 are diagrams for explaining the operation of a semiconductor device according to exemplary embodiments.

First, an operation in which the semiconductor device determines a digital signal corresponding to an analog input signal will be described with reference to FIGS. 1 and 5.

Figures 5, 6:
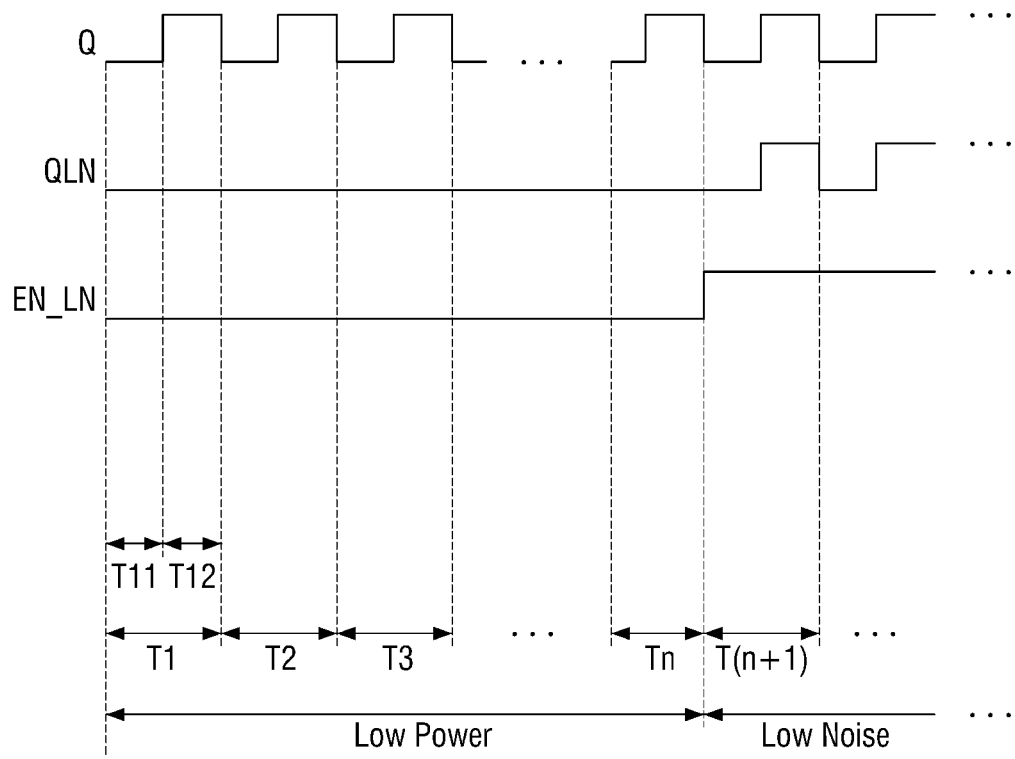
FIGS. 5 to 13 are diagrams for explaining the operation of a semiconductor device according to exemplary embodiments.

Referring to FIGS. 1 and 5, at a first period T1, the comparator 200 compares the input signal IS with the reference signal RS to generate a comparison signal CS1 in accordance with the comparison result. The comparison signal CS1 may be referred to as a first comparison signal, and may be generated using the first pre-amplifier 210 and the shared latch 230. In an exemplary embodiment, the comparison signal CS1 may be generated without using the second pre-amplifier 220, as described in further detail below. Also, the control logic 300 may determine a first bit value B1 of the digital signal corresponding to the analog input signal IS in accordance with the signal level of the comparison signal CS1. Here, the expression of determination of the bit value B1 does not mean that the bit value B1 included in the final digital signal to be output from the control logic 300 is finally decided at the timing when the first period T1 ends, but means that the bit value B1 is tentatively determined. The value of the tentatively decided bit value B1 may be changed depending on the subsequent operation of the control logic 300 and may be decided as the bit value of the final digital signal.

If the first bit value B1 of the digital signal corresponding to the analog input signal IS is determined depending on the signal level of the comparison signal CS1, the control logic 300 outputs the control signal RCON1 on the basis of the result thereof. The reference signal adjusting circuit 400 provided with the control signal RCON1 may adjust the reference signal RS to be provided to the comparator 200. Herein, each adjusted reference signal RS corresponding to different control signals (e.g., RCON1, RCON2, etc.) may be referred to as a first reference signal, a second reference signal, etc.

For example, if the input signal IS (e.g., it may be an input voltage, and the input voltage will be described as an example for convenience of the following description) is greater than a reference signal RS (e.g., it may be a reference voltage, and the reference voltage will be described as an example for convenience of the following description), the control logic 300 may output a control signal RCON1 that increases the magnitude of the reference voltage. Conversely, if the input voltage is smaller than the reference voltage, the control logic 300 may output a control signal RCON1 that decreases the magnitude of the reference voltage.

At a next second period T2, the comparator 200 compares the input signal IS with the reference signal RS now adjusted by the control signal RCON1 to generate a comparison signal CS2 in accordance with the comparison result. The comparison signal CS2 may be referred to as a second comparison signal, and may be generated using the second pre-amplifier 220 and the shared latch 230. The comparison signal CS1 may be generated prior to the comparison signal CS2, and the comparison signal CS2 may be output later than the comparison signal CS1. In exemplary embodiments, the comparison signal CS2 may be generated using the first pre-amplifier 210 and the second pre-amplifier 220, or the comparison signal CS2 may be generated without using the first pre-amplifier 210, as described in more detail below. In exemplary embodiments, the comparator 200 may output the comparison signal CS1 using the first pre-amplifier 210, the low noise reset circuit LNRC1, and the amplifier circuit AC, without using the second pre-amplifier 220 and the low noise reset circuit LNRC2. In exemplary embodiments, the comparator 200 may output the comparison signal CS2 using the first and second pre-amplifiers 210 and 220, the low noise reset circuits LNRC1 and LNRC2, and the amplifier circuit AC. Further, the control logic 300 may determine the second bit value B2 of the digital signal corresponding to the analog input signal IS in accordance with the signal level of the comparison signal CS2. If the second bit value B2 of the digital signal corresponding to the analog input signal IS is determined in accordance with the signal level of the comparison signal CS2, the control logic 300 outputs the control signal RCON2 on the basis of the result thereof. The reference signal adjusting circuit 400 provided with the control signal RCON2 may adjust the reference signal RS to be provided to the comparator 200 again. Such an operation may continue until the timing at which the redundancy bit is determined.

Next, at an $n^{th}$ period Tn and an $(n+1)^{th}$ period T(n+1) (where n is a natural number) at which it is necessary to determine the bit value corresponding to the redundancy bit, the control logic 300 determines an $n^{th}$ bit value Bn and a $(n+1)^{th}$ bit value B(n+1) through the operation described above, executes a preset redundancy operation, and may determine the bit value of the redundancy bit on the basis of the $n^{th}$ bit value Bn and the $(n+1)^{th}$ bit value B(n+1). In exemplary embodiments, the previously determined bit values (e.g., B1, B2, etc.) may be changed in this process. In exemplary embodiments, a subsequent bit value corresponding to the input signal IS may be determined by performing a predetermined operation, as described herein, based on previously determined bit values (e.g., B1, B2).

Hereinafter, the process of determining the bit values will be described in more detail with reference to FIGS. 6 through 13.

Referring to FIG. 6, at a 1-$1^{st}$ section T11 included in the first section T1, the first clock signal Q is a logic low level (hereinafter referred to as L), and the second clock signal QLN and the first enable signal EN_LN are also a logic low level L.

Figure 7:
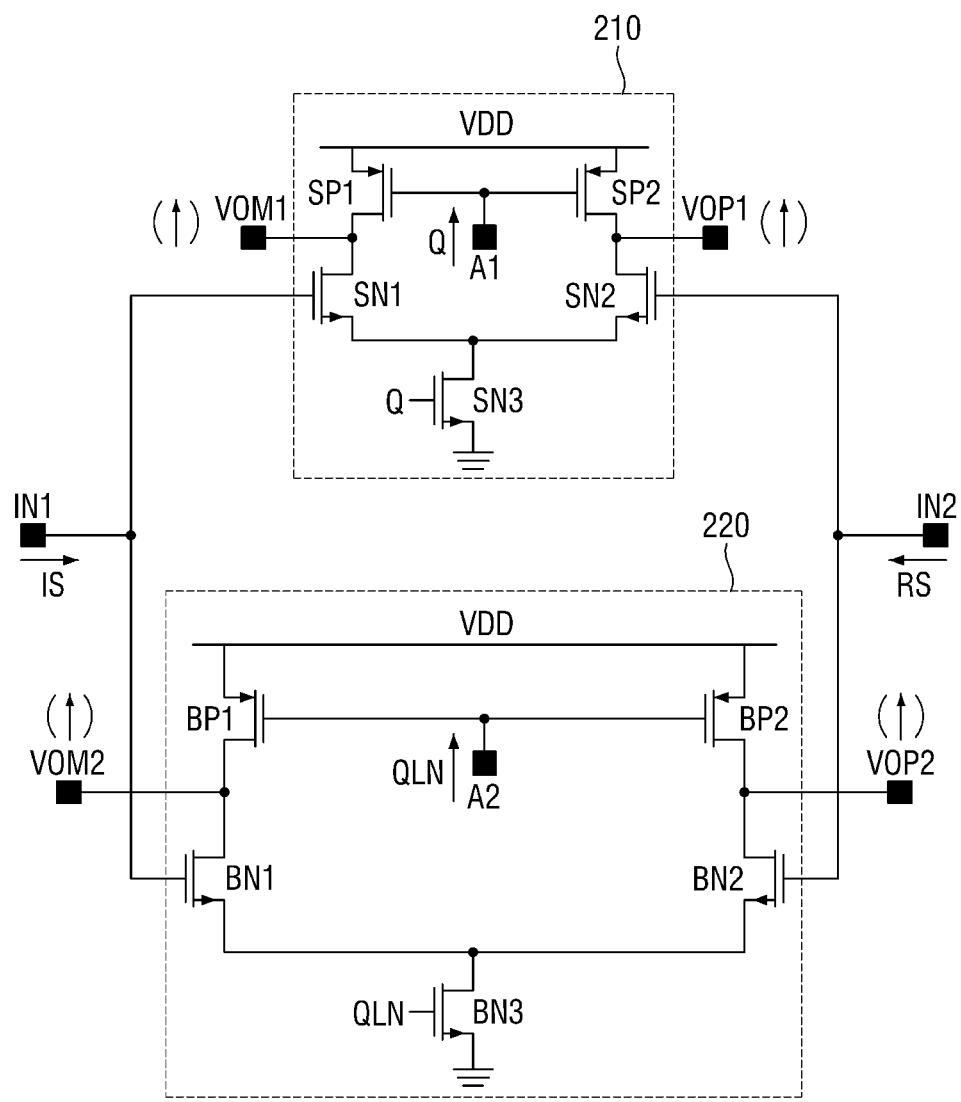

Referring to FIG. 7, since the first clock signal Q is the logic low level L, the transistors SP1 and SP2 are turned on, and the transistor SN3 is turned off. As a result, the voltage levels of the output nodes VOM1 and VOP1 increase.

On the other hand, since the second clock signal QLN is also the logic low level L, the transistors BP1 and BP2 are turned on, and the transistor BN3 is turned off. As a result, the voltage levels of the output nodes VOM2 and VOP2 increase.

Figure 8:
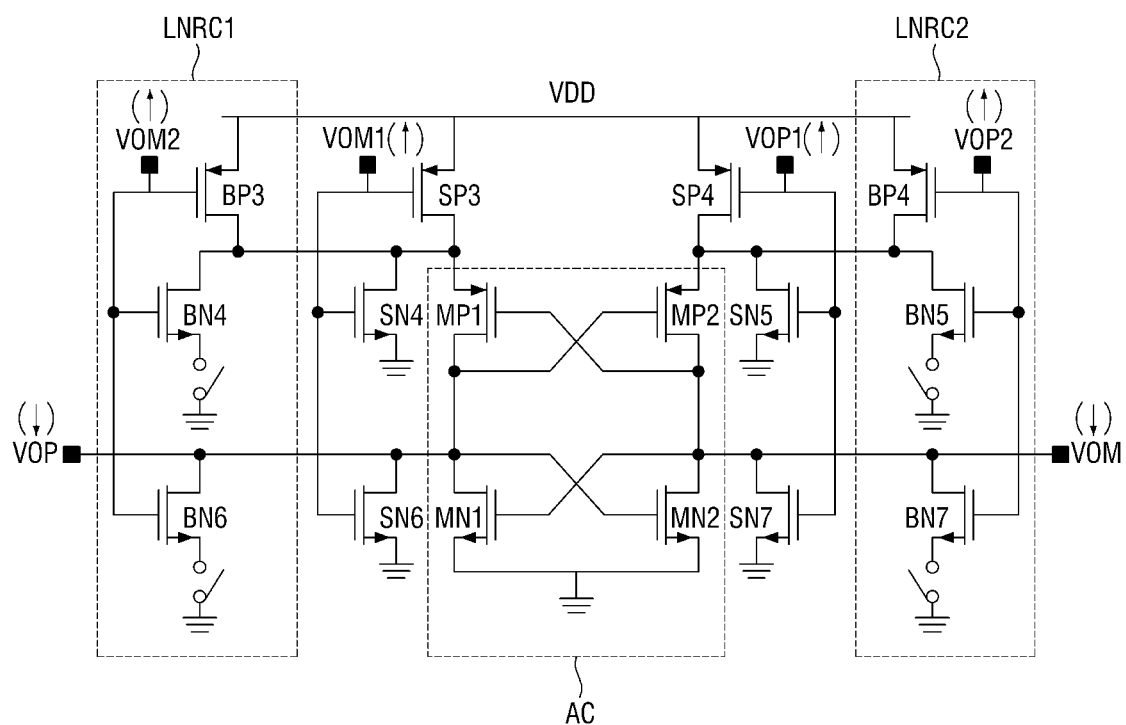

Referring now to FIG. 8, as the voltage levels of the output nodes VOM1, VOP1, VOM2 and VOP2 increase, the transistors SN6, SN7, BN6 and BN7 are turned on. Therefore, the transistor SN6 and the transistor SN7 ground the output nodes VOM and VOP, and the voltage levels of the output nodes VOM and VOP decrease. Although the transistor BN6 and the transistor BN7 are turned on, since the first enable signal (EN_LN of FIG. 6) is the logic low level L and the switch is in the off-state, the output nodes VOM and VOP are not grounded. That is, the transistor BN6 and the transistor BN7 are not involved in the decrease in the voltage levels of the output nodes VOM and VOP. That is, the low noise reset circuits LNRC1 and LNRC2 are disabled. Thus, the first enable signal EN_LN, which may be included in the second control signal PCON, may determine whether the low noise reset circuit LNRC2 is enabled.

Referring again to FIG. 6, at a 1-$2^{nd}$ section T12 subsequent to the 1-$1^{st}$ section T11, the first clock signal Q is a logic high level (hereinafter, H), but the second clock signal QLN and the first enable signal EN_LN maintain a logic low level L.

Figure 9:
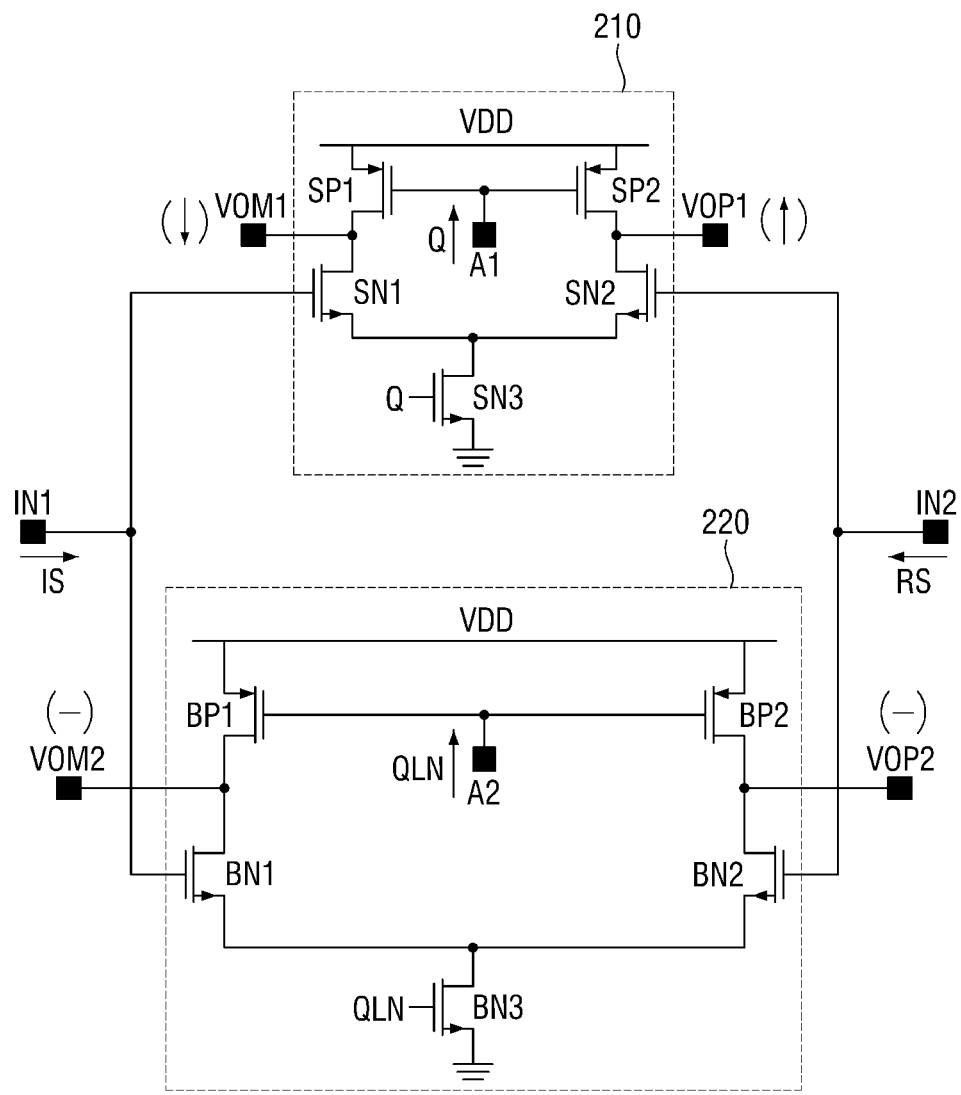

Next, referring to FIG. 9, since the first clock signal Q is the logic high level H, the transistors SP1 and SP2 are turned off and the transistor SN3 is turned on. Therefore, the voltage levels of the output nodes VOM1 and VOP1 are determined by the input voltage (IS, the input signal will be described as the input voltage for convenience hereinafter), and the reference voltage (RS, the reference signal will be described as the reference voltage for convenience hereinafter).

For example, assuming that the input voltage IS is greater than the reference voltage RS, the voltage level of the output node VOM1 may relatively decrease by the transistors SN1, SN2 and SN3, and the voltage level of the output node VOP1 may relatively increase.

On the other hand, since the second clock signal QLN maintains the logic low level L, the transistors BP1 and BP2 maintain the turn-on state, and the transistor SN3 maintains the turn-off state. The voltage levels of the output nodes VOM2 and VOP2 maintain the power supply voltage VDD level as it is without change. That is, the voltage levels of the output node VOM2 and VOP2 maintain a constant voltage level regardless of the magnitude of the input voltage IS or the reference voltage RS. That is, the second pre-amplifier 220 is disabled.

Figure 10:
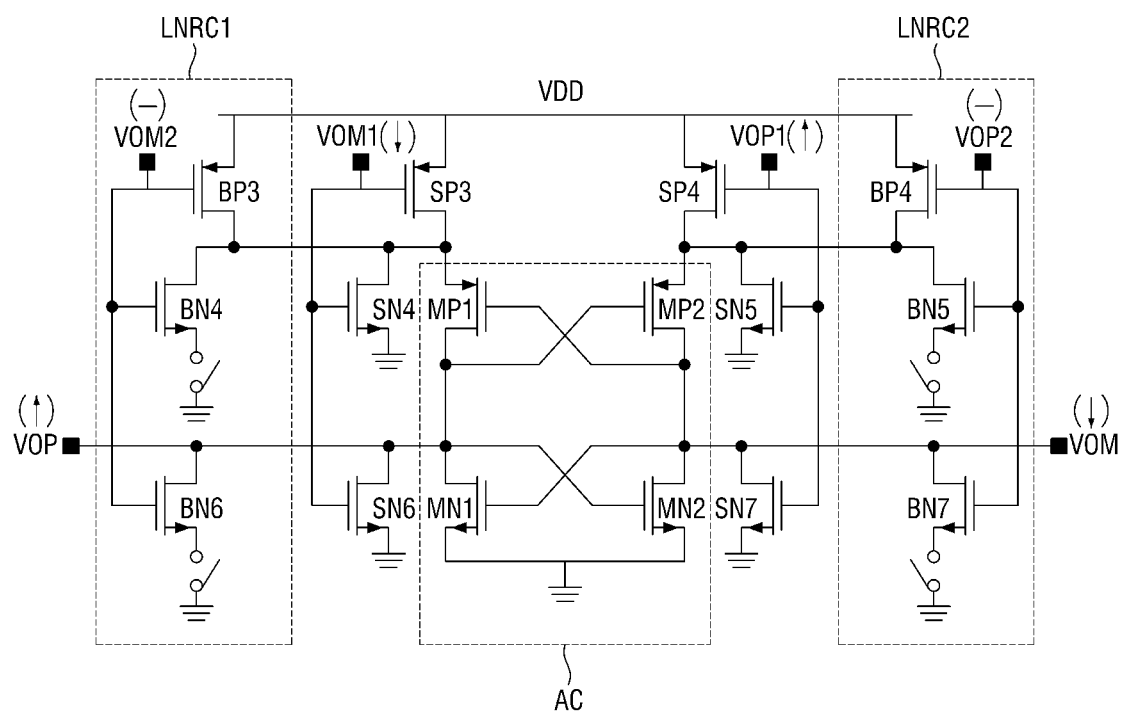

Referring now to FIG. 10, as the voltage level of the output node VOM1 decreases, the power supply voltage VDD is provided to the output node VOP, and the voltage level of the output node VOP increases. Also, as the voltage level of the output node VOP1 increases, the ground voltage is provided to the output node VOM, and the voltage level of the output node VOM decreases. The amplifier circuit AC further amplifies the voltage level difference between the output nodes VOM and VOP, the voltage level of the output node VOM finally becomes a logic low level L, and the voltage level of the output node VOP finally becomes a logic high level H. For example, when assuming that the voltage level of the output node VOP becomes the signal level of the comparison signal (CS of FIG. 2), if the input voltage IS is larger than the reference voltage RS, the signal level of the comparison signal (CS of FIG. 2) becomes a logic high level H. Conversely, if the input voltage IS is smaller than the reference voltage RS, the signal level of the comparison signal (CS of FIG. 2) becomes a logic low level L.

In exemplary embodiments, the signal level of the comparison signal (CS of FIG. 2) may be determined on the basis of at least one of the voltage level of the output node VOP and the voltage level of the output node VOM.

On the other hand, since the first enable signal (EN_LN of FIG. 6) is still a logic low level L, the switch is in the off-state. Thus, the low noise reset circuits LNRC1 and LNRC2 are not involved in generation of the comparison signal (CS of FIG. 2). That is, the low noise reset circuits LNRC1 and LNRC2 maintain the disabled state.

Figure 11:
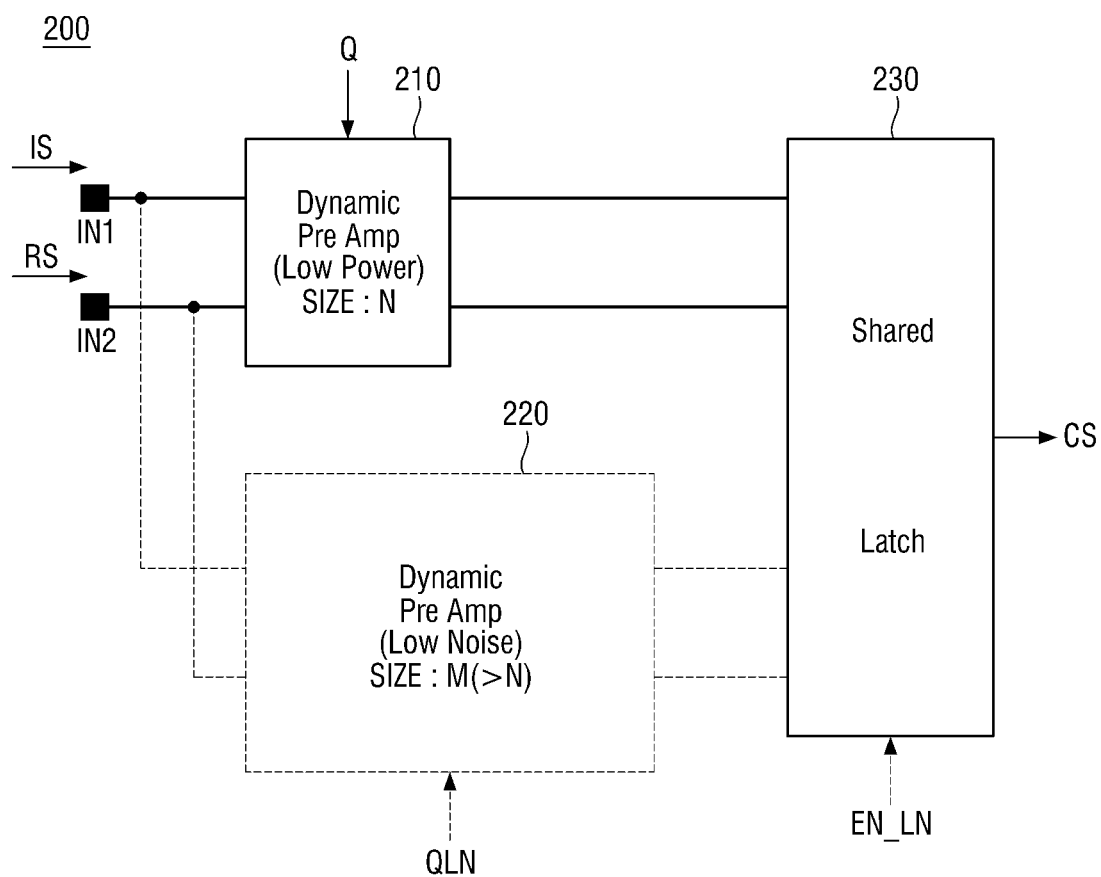

Referring to FIGS. 6 and 11, at a second period T2 and a third period T3 following the first period T1, the input signal IS and the reference signal RS are compared to generate the comparison signals, and the bit values (e.g., B1, B2 and B3 of FIG. 5) of the digital signal may be determined using the comparison signals. Such an operation may continue until the section Tn, at which the control logic 300 determines some bit value Bn among the bit values for determining the redundancy bit described above.

That is, as shown in FIG. 11, the comparator 200 may generate the comparison signal CS using only the first pre-amplifier 210 and the shared latch 230 from the first section T1 to the $n^{th}$ section Tn. At this time, the second pre-amplifier 220 is disabled by the second clock signal QLN, and the low-noise reset circuits (LNRC1 and LNRC2 of FIG. 4) of the shared latch 230 may be disabled by the first enable signal EN_LN. Therefore, the comparator 200 may operate in the low power mode that minimizes the electric power consumption from the first section T1 to the $n^{th}$ section Tn.

Referring again to FIG. 6, at the (n+1) period T(n+1) subsequent to the $n^{th}$ period Tn, the first clock signal Q transitions from the logic low level L to the logic high level H similarly to the operation described above, and the second clock signal QLN also transitions from the logic low level L to the logic high level H. Further, the first enable signal EN_LN maintains a logic high level H.

Figure 12:
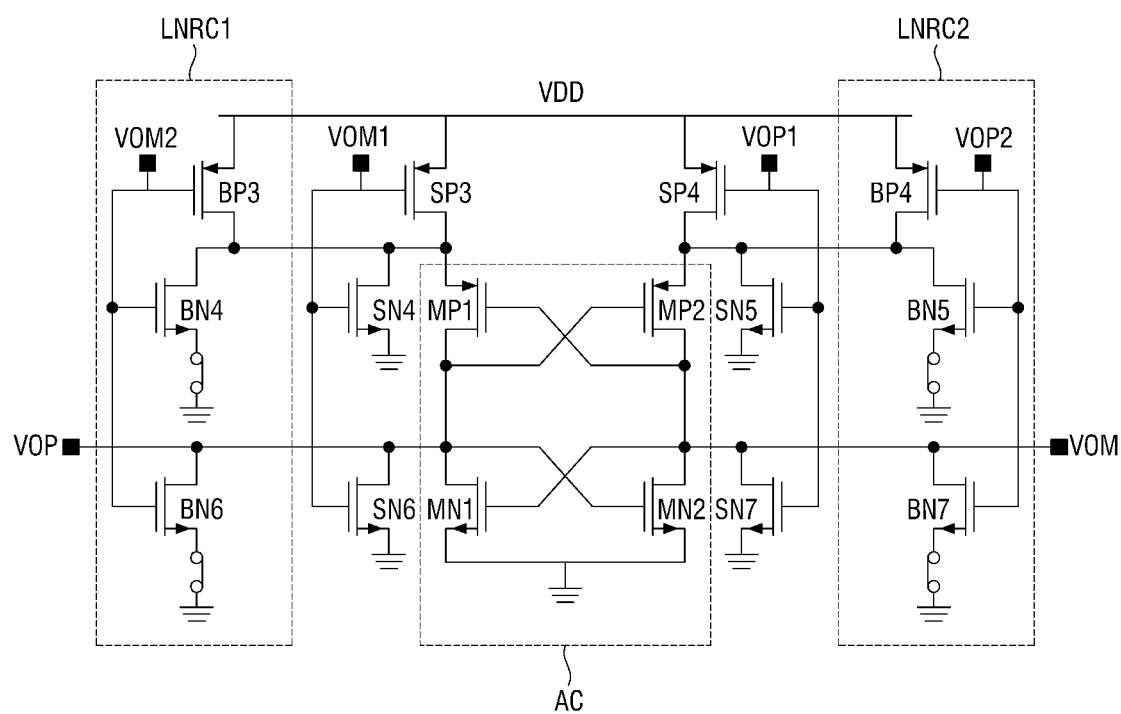

Accordingly, all of the switches of the shared latch 230 are turned on as shown in FIG. 12. That is, the low noise reset circuits LNRC1 and LNRC2 are enabled. On the other hand, since the second clock signal QLN is also input in the same way as the first clock signal Q, the second pre-amplifier 220 also amplifies the difference between the input voltage IS and the reference voltage RS, and provides it to the shared latch 230.

Figure 13:
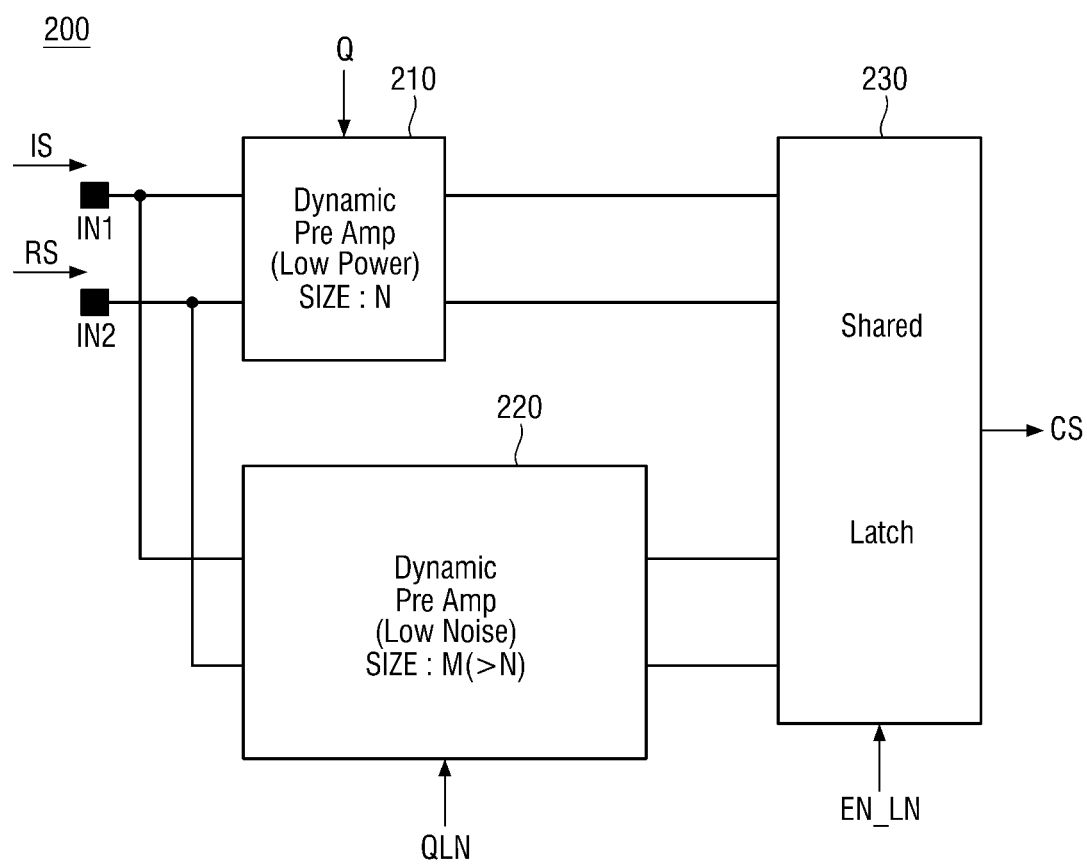

That is, as shown in FIG. 13, the comparator 200 generates the comparison signal CS using all of the first pre-amplifier 210, the second pre-amplifier 220 and the shared latch 230 after the (n+1) section T(n+1). Accordingly, the comparator 200 may operate in the low noise mode in which the comparison accuracy is further improved, after the (n+1) section T(n+1).

In summary, in the semiconductor device according to an exemplary embodiment, the control logic 300 generates the comparison signal (CS of FIG. 2) using only the first pre-amplifier (210 of FIG. 2) and the shared latch (230 of FIG. 2) up to a section (Tn of FIG. 6) for determining some bit values (Bn of FIG. 5) among the bit values for determining the redundancy bits described above. Further, the control logic 300 generates the comparison signal (CS of FIG. 2) using all of the first pre-amplifier (210 of FIG. 2), the second pre-amplifier (220 of FIG. 2) and the shared latch (230 of FIG. 2) from the section (T(n+1) of FIG. 6) for determining the remaining bit value (B(n+1) of FIG. 5) among the bit values for determining the redundancy bits.

An example in which the comparator 200 operates in the low power mode that minimizes the electric power consumption, and then, after specific timing, the comparator 200 operates in the low noise mode in which the comparison accuracy is further improved, has been described above. However, exemplary embodiments are not limited thereto. For example, in exemplary embodiments, the comparator 200 may operate only in the low power mode until all of the bit values are determined in situations in which the accuracy of determination of the bit value is not relatively important (i.e., when a low resolution ADC operation is required). That is, the comparator 200 may determine all of the bit values of the input signal (IS of FIG. 2) using only the first pre-amplifier (210 of FIG. 2) of the first pre-amplifier (210 of FIG. 2) and the second pre-amplifier (220 of FIG. 2) until all of the bit values are determined.

Figure 14:
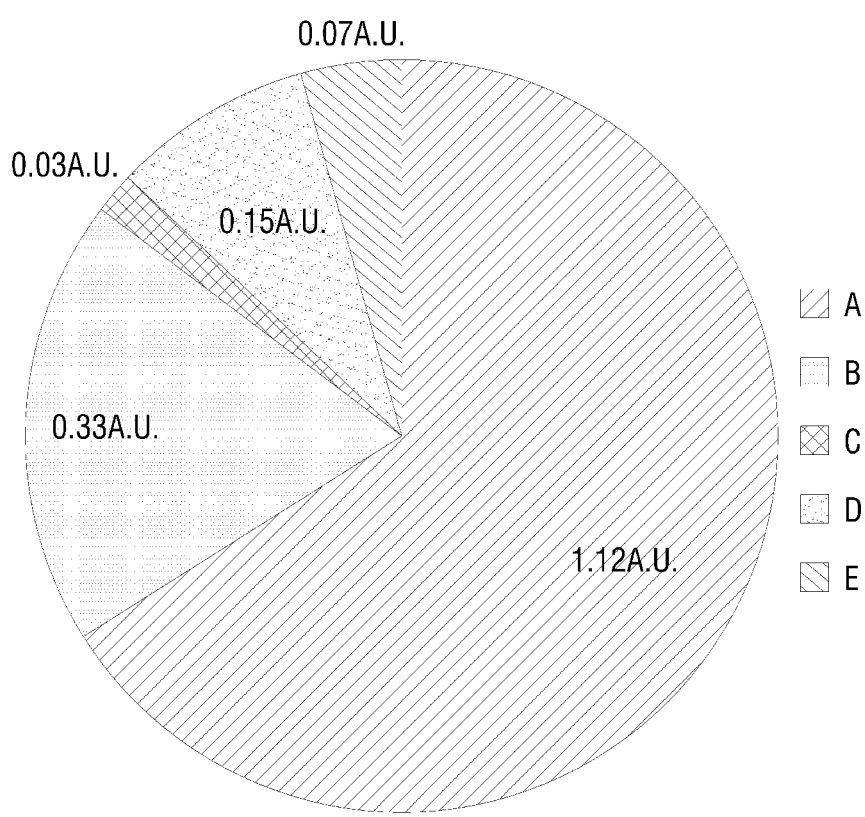
FIGS. 14 and 15 are diagrams for explaining the effects of a semiconductor device according to exemplary embodiments.
Figure 15:
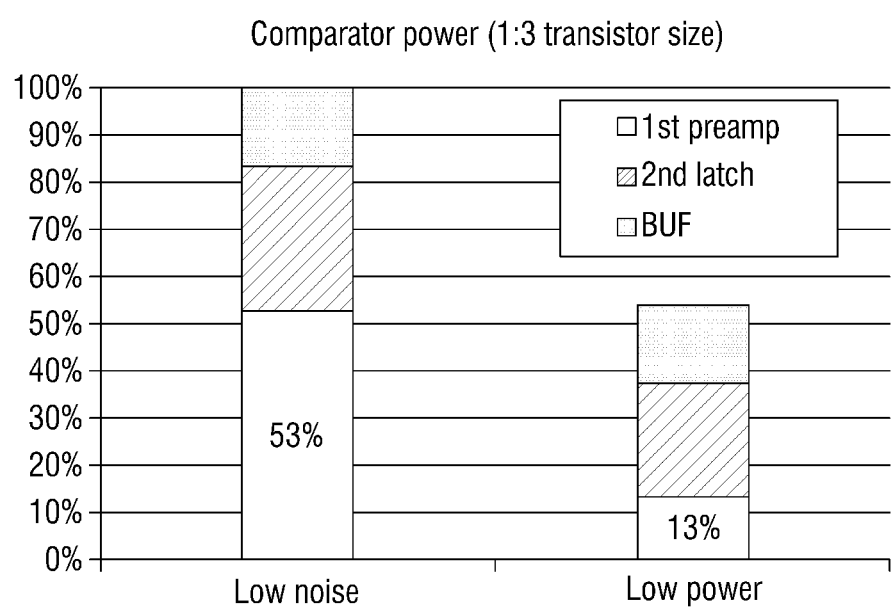

FIGS. 14 and 15 are diagrams for explaining the effects of a semiconductor device according to exemplary embodiments.

FIG. 14 is a graph showing an electric power consumption ratio for each functional block in the SAR ADC. A is an amount of electric power consumed by the comparator, B is an amount of electric power consumed by the SAR logic, C is an amount of electric power consumed by the sampling circuit, D is an amount of electric power consumed by the clock generation circuit, and E is an amount of electric power consumed by the reference signal adjusting circuit.

Referring to FIG. 14, it can be seen that the electric power consumption ratio of the comparator is close to about 70% of the total amount of electric power consumption in the recently used SAR ADC. That is, it can be seen that when reducing the electric power consumption of the comparator, the electric power consumption reduction effect of the entire SAR ADC is significant.

FIG. 15 is a graph showing that, when the size of the first pre-amplifier (210 of FIG. 2) and the size of the second pre-amplifier (220 of FIG. 2) are designed at a ratio of 1:3 and the comparator is operated in a manner described above, the amount of electric power consumption of each functional module are compared with each other. Here, the configuration in which the size of the first pre-amplifier (210 of FIG. 2) and the size of the second pre-amplifier (220 of FIG. 2) are at a ratio of 1:3 means that the size of the transistors constituting the first pre-amplifier (210 of FIG. 2) and the size of the transistors constituting the second pre-amplifier (220 of FIG. 2) are designed to be at a ratio of 1:3.

In the low power mode, the comparison signal (CS of FIG. 2) is generated using only the first pre-amplifier (210 of FIG. 2) and the shared latch (230 of FIG. 2). In the low noise mode, the comparison signal (CS of FIG. 2) is generated using all of the first pre-amplifier (210 of FIG. 2), the second pre-amplifier (220 of FIG. 2) and the shared latch (230 of FIG. 2).

Referring to FIG. 15, even when assuming that the amounts of electric power consumption of the latch module and the buffer module are maintained as they are, if the electric power consumption of the pre-amplifier module operates in the low power mode, the electric power consumption decreases to almost ¼ level, and half of the total electric power consumption may decrease to ½ level.

Figure 16:
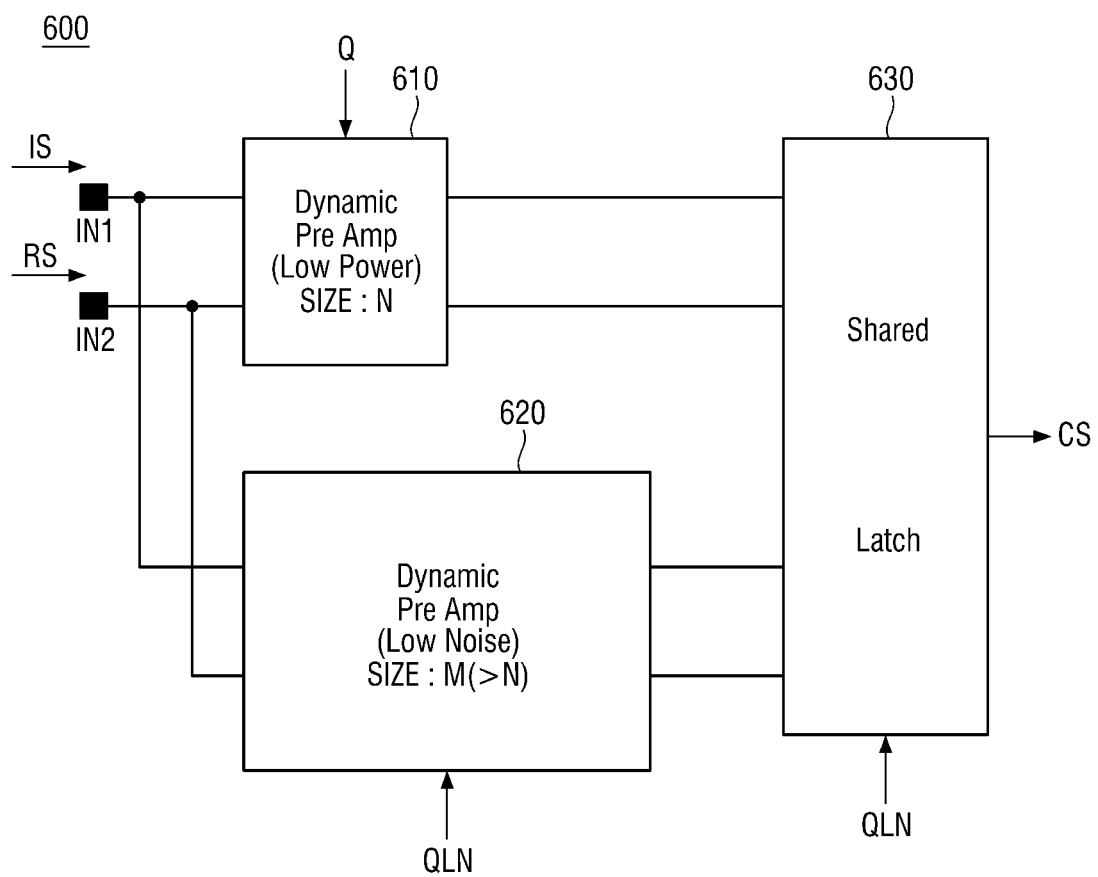
FIG. 16 is a block diagram of a semiconductor device according to exemplary embodiments.

FIG. 16 is a block diagram of a semiconductor device according to exemplary embodiments.

Hereinafter, for convenience of explanation, a repeated description of elements and aspects previously described may be omitted.

Referring to FIG. 16, a comparator 600 of the semiconductor device according to an exemplary embodiment includes a first pre-amplifier 610, a second pre-amplifier 620, and a shared latch 630. However, unlike previous exemplary embodiments, the same second clock signal QLN may be provided to the second pre-amplifier 620 and the shared latch 630, instead of providing different signals (QLN and EN_LN of FIG. 2) to the second pre-amplifier 620 and the shared latch 630. As a result, the comparator 600 generates the comparison signal CS using only the pre-amplifier 610 and the shared latch 630 up to the section (Tn of FIG. 6) for determining some bit values (Bn of FIG. 5) among the bit values for determining the redundancy bits in the low power mode. Further, the comparator 600 may generate the comparison signal CS using all of the first pre-amplifier 610, the second pre-amplifier 620 and the shared latch 630 from the section (T(n+1) of FIG. 6) for determining the remaining bit values (B(n+1) of FIG. 5) among the bit values for determining the redundancy bit.

Figure 17:
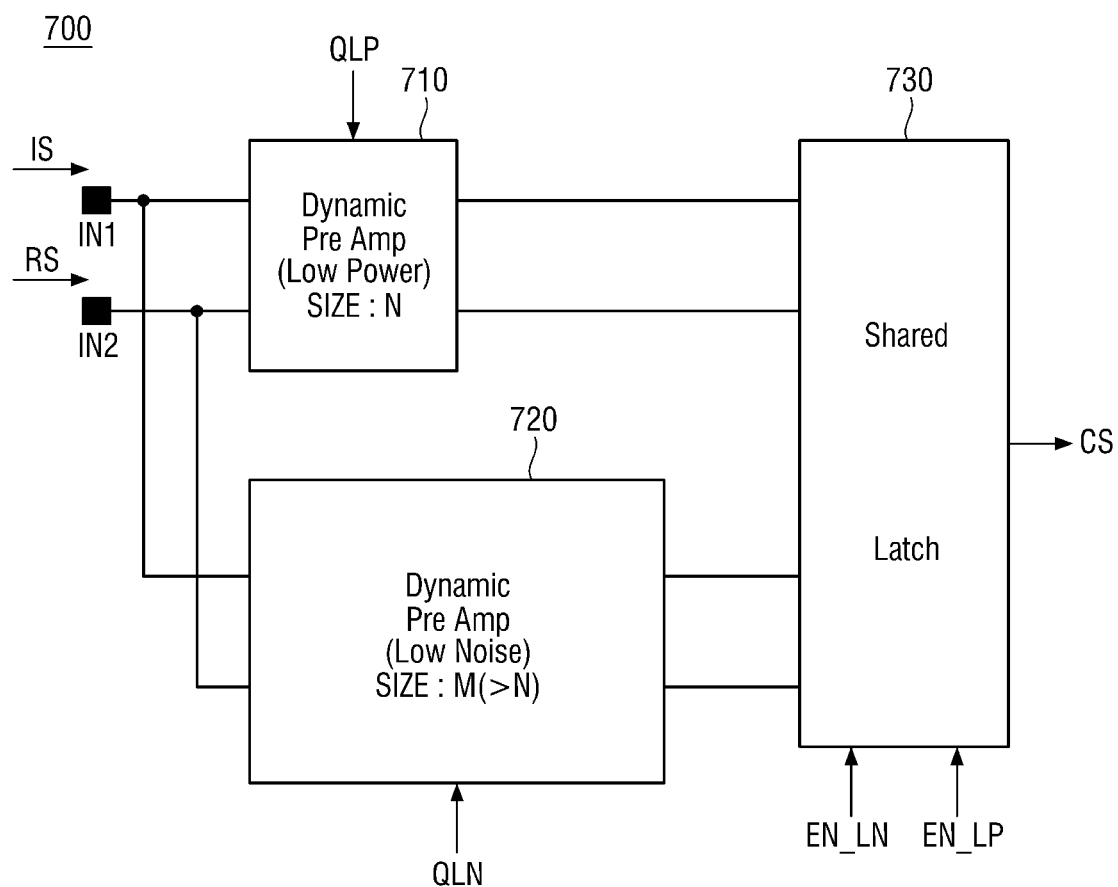
FIG. 17 is a block diagram of a semiconductor device according to exemplary embodiments.
Figure 18:
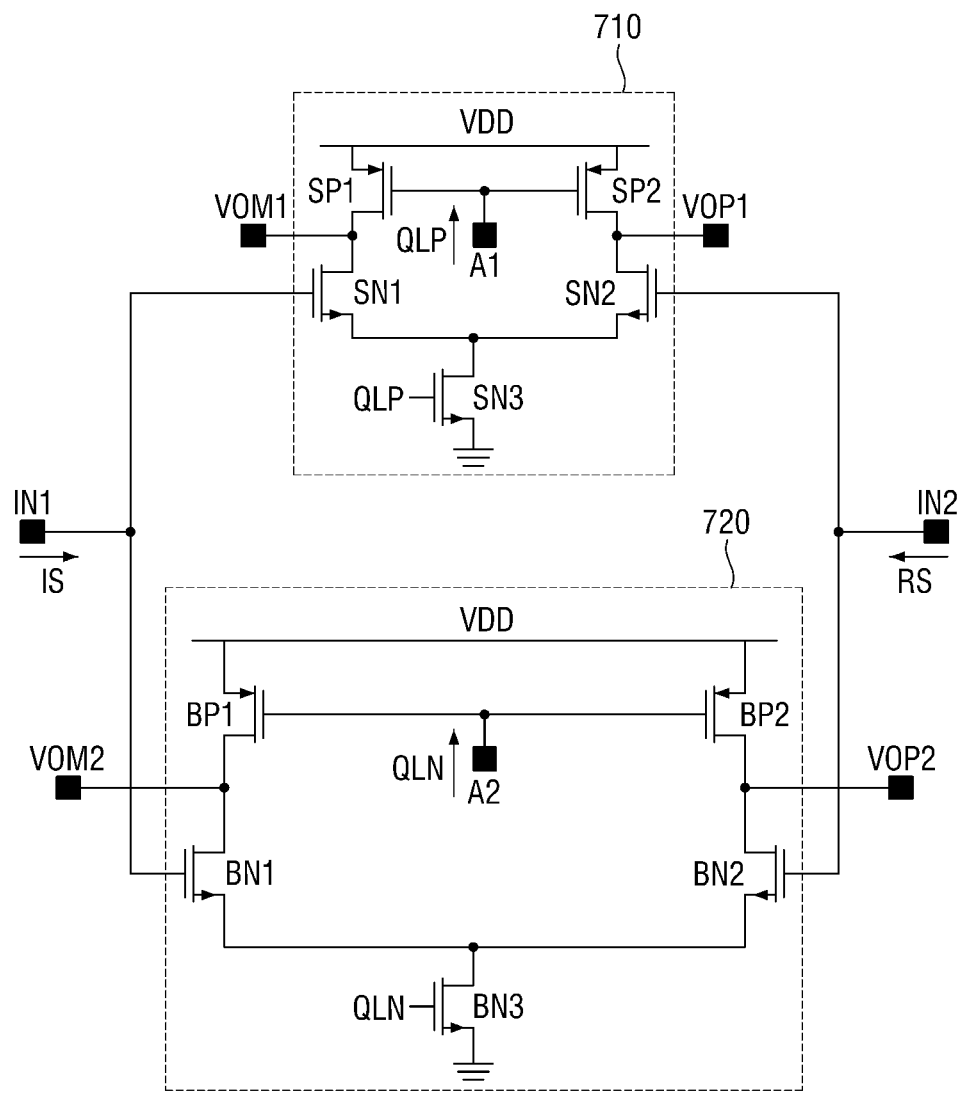
FIG. 18 is an exemplary circuit diagram of the first and second pre-amplifiers of FIG. 17.
Figure 19:
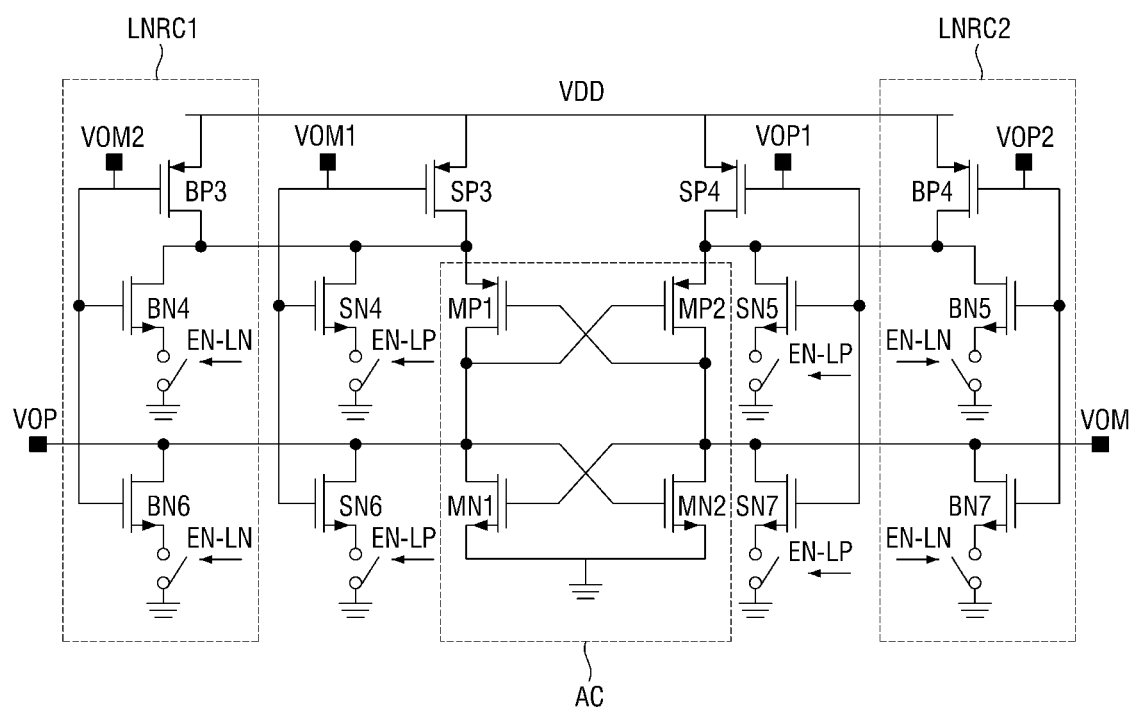
FIG. 19 is an exemplary circuit diagram of the shared latch of FIG. 17.

FIG. 17 is a block diagram of a semiconductor device according to exemplary embodiments. FIG. 18 is an exemplary circuit diagram of the first and second pre-amplifiers of FIG. 17. FIG. 19 is an exemplary circuit diagram of the shared latch of FIG. 17.

Hereinafter, for convenience of explanation, a further description of elements and aspects previously described may be omitted.

Referring to FIG. 17, a comparator 700 of a semiconductor device according to an exemplary embodiment includes a first pre-amplifier 710, a second pre-amplifier 720, and a shared latch 730. A third clock signal QLP is provided to the first pre-amplifier 710, a second clock signal QLN is provided to the second pre-amplifier 720, and a first enable signal EN_LN and a second enable signal EN_LP are provided to the shared latch 730.

Referring to FIG. 18, the third clock signal QLP is provided to a node A1 of the first pre-amplifier 710, and the transistor SN3 may be gated by the signal level of the third clock signal QLP.

Referring to FIG. 19, the shared latch 730 may further include a plurality of switches controlled by the second enable signal EN_LP. For example, a plurality of switches controlled by the second enable signal EN_LP may be further disposed at the sources of the transistors SN4 to SN7.

Figure 20:
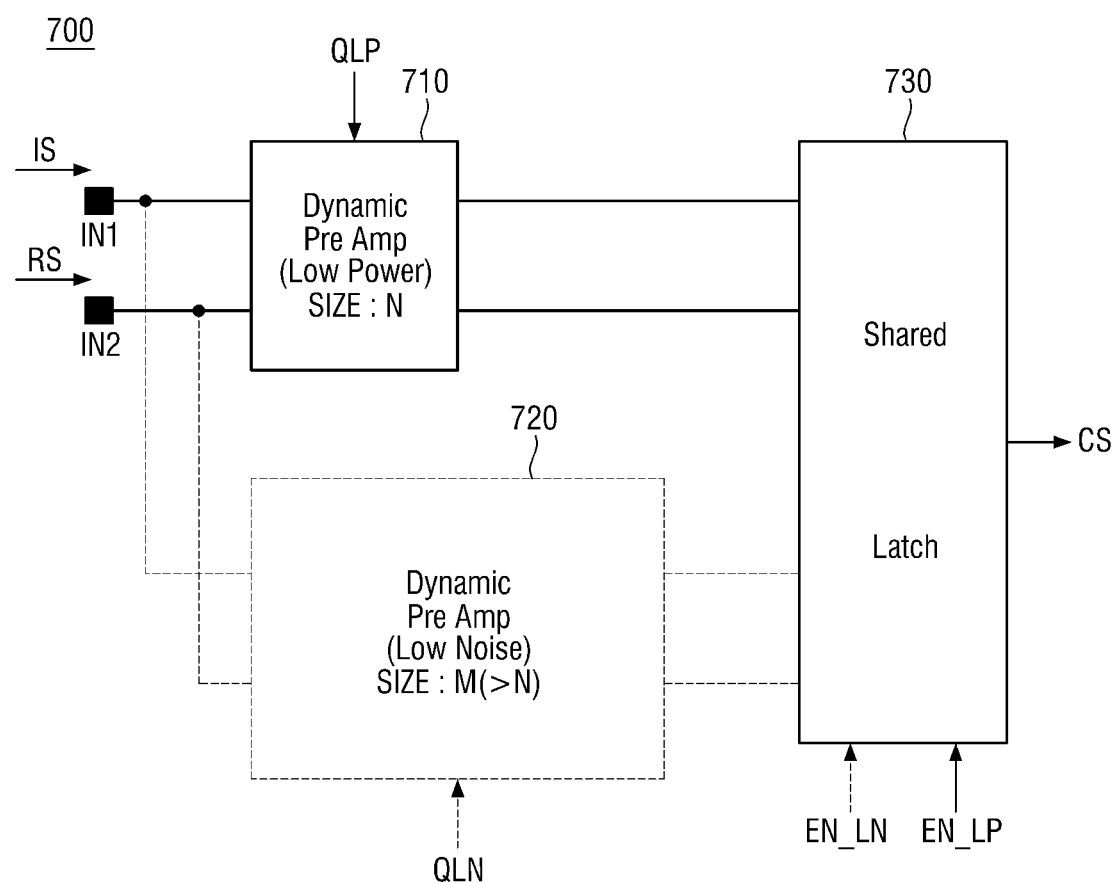
FIGS. 20 and 21 are diagrams for explaining the operation of a semiconductor device according to exemplary embodiments.
Figure 21:
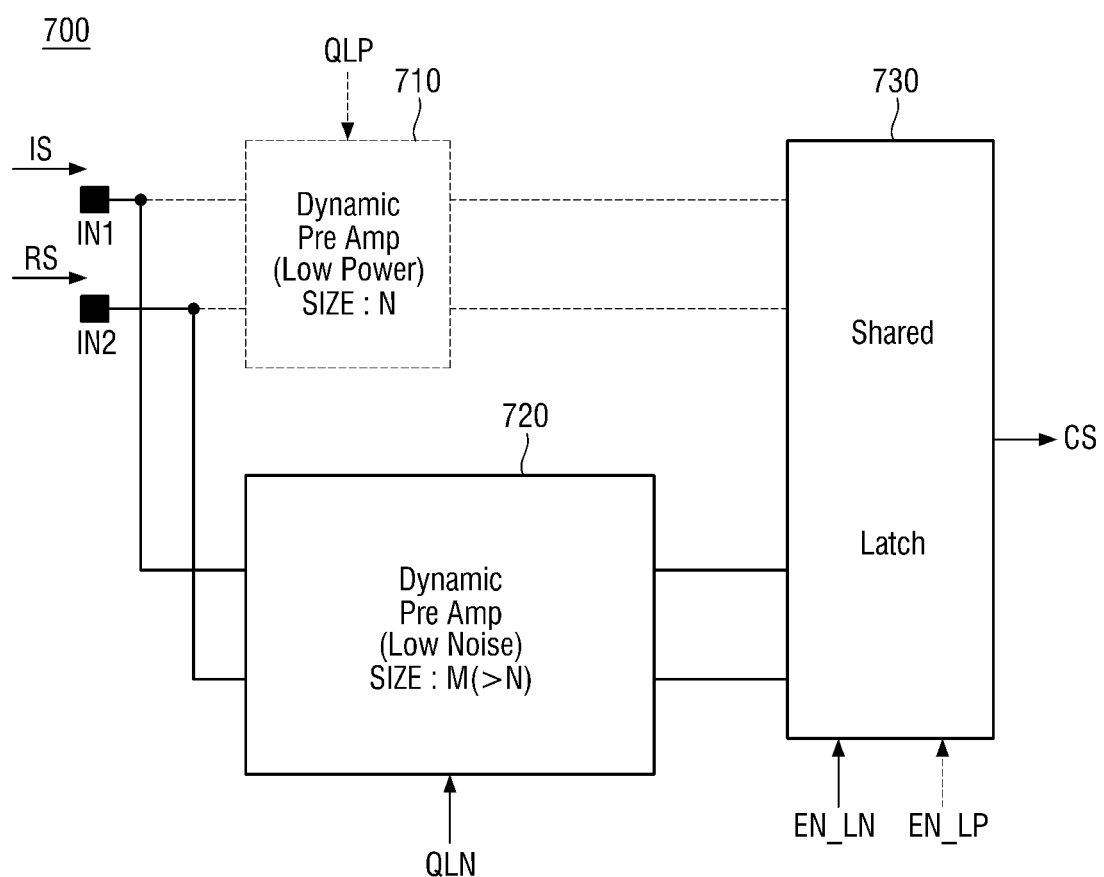

FIGS. 20 and 21 are diagrams for explaining the operation of a semiconductor device according to exemplary embodiments.

First, referring to FIG. 20, in the low power mode, for example, the control logic (300 of FIG. 1) transitions the signal level of the third clock signal QLP to repeat the logic low level L and the logic high level H, and may maintain the signal level of the second clock signal QLN at a logic low level L. Also, the control logic (300 of FIG. 1) may maintain the signal level of the first enable signal EN_LN at the logic low level L and maintain the signal level of the second enable signal EN_LP at the logic high level H in the low power mode.

As a result, the first pre-amplifier 710 is enabled, the second pre-amplifier 720 is disabled, and the comparison signal CS may be generated through the shared latch 730. At this time, since the switches are in the on-state, the transistors SN4 to SN7 of the shared latch 730 of FIG. 19 may supply the ground voltage to the output nodes VOM and VOP. However, since the switches are in the off-state, in an exemplary embodiment, the transistors BN4 to BN7 do not provide the ground voltage to the output nodes VOM and VOP. That is, the low noise reset circuits LNRC1 and LNRC2 may be disabled.

Next, referring to FIG. 21, in the low noise mode, for example, the control logic (300 of FIG. 1) maintains the signal level of the third clock signal QLP at the logic low level L and may transition the signal level of the second clock signal QLN to repeat the logic low level L and the logic high level H. Also, the control logic (300 of FIG. 1) may maintain the signal level of the first enable signal EN_LN at the logic high level H and maintain the signal level of the second enable signal EN_LP at the logic low level L in the low noise mode.

Accordingly, the first pre-amplifier 710 is disabled, the second pre-amplifier 720 is enabled, and the comparison signal CS may be generated through the shared latch 730. That is, in the case of an exemplary embodiment, in the low noise mode, both the first pre-amplifier 710 and the second pre-amplifier 720 are not enabled, but rather, only the second pre-amplifier 720 is enabled.

At this time, since the switches are in the on-state, the transistors BN4 to BN7 of the shared latch 730 of FIG. 19 may provide the ground voltage to the output nodes VOM and VOP. However, since the switches are in the off-state, in an exemplary embodiment, the transistors SN4 to SN7 do not provide the ground voltage to the output nodes VOM and VOP. That is, the low noise reset circuits LNRC1 and LNRC2 may be enabled to generate the comparison signal CS.

Figure 22:
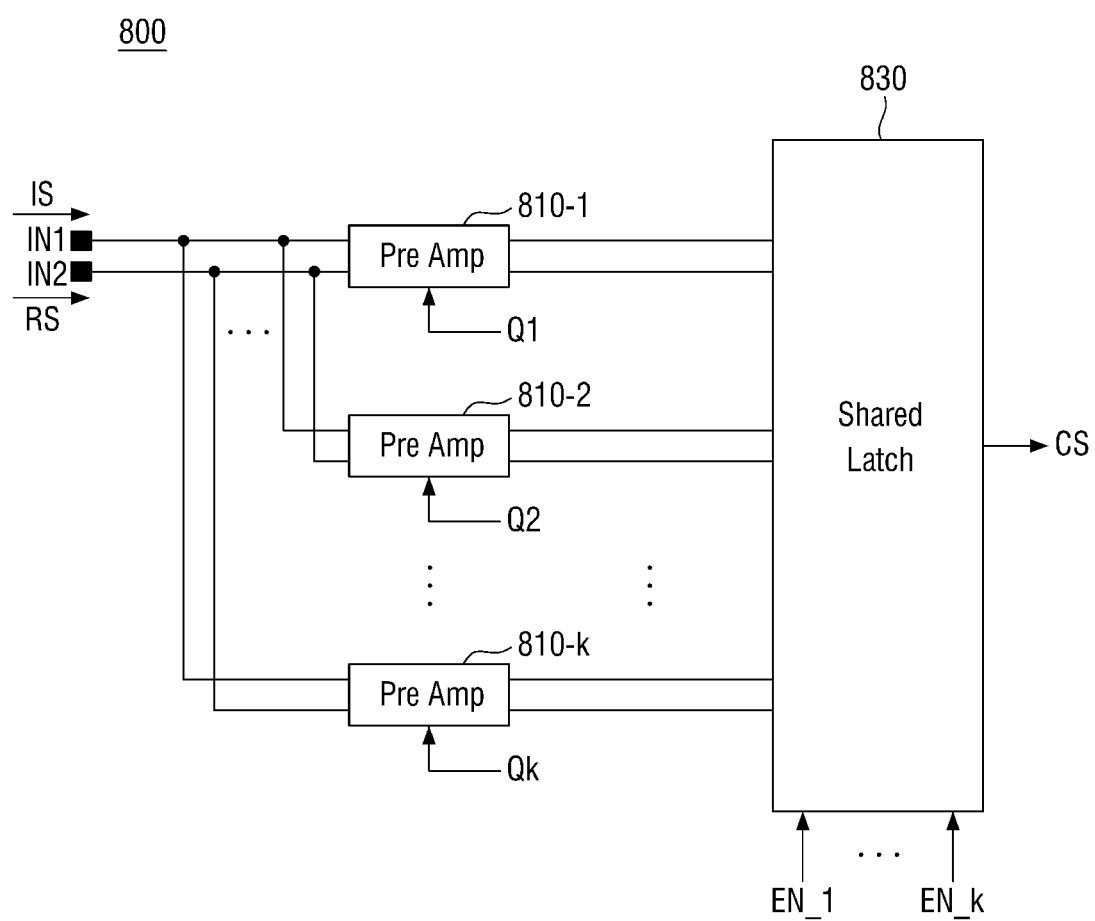
FIG. 22 is a block diagram of a semiconductor device according to exemplary embodiments.

FIG. 22 is a block diagram of a semiconductor device according to exemplary embodiments.

Referring to FIG. 22, a comparator 800 of a semiconductor device according to an exemplary embodiment may include a plurality of pre-amplifiers 810-1 to 810-k (where k is a natural number). Clock signals Q1 to Qk different from each other may be provided to each of the pre-amplifier 810-1 to 810-k.

The plurality of pre-amplifiers 810-1 to 810-k may be connected to the shared latch 830. That is, the plurality of pre-amplifiers 810-1 to 810-k may share one latch to generate the comparison signal CS. A plurality of enable signals EN_1 to EN_k may be provided to the shared latch 830 to determine whether the functional circuits located in the shared latch 830 are enabled.

As is traditional in the field of the present invention, exemplary embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, etc., which may be formed using semiconductor-based fabrication techniques or other manufacturing technologies.

In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions.

While the present invention has been particularly shown and described with reference to the exemplary embodiments thereof, it will be understood by those of ordinary skill in the art that various changes in form and detail may be made therein without departing from the spirit and scope of the present invention as defined by the following claims.

What is claimed is:

1. An analog-to-digital converter, comprising:
a comparator configured to compare an input signal with a reference signal, and to output a comparison signal indicating a corresponding comparison result;
a control logic configured to output a control signal for adjusting the reference signal based on the comparison signal; and
a reference signal adjusting circuit configured to adjust the reference signal based on the control signal,
wherein the comparator comprises:
a first pre-amplifier configured to amplify a difference between the input signal and the reference signal using a first transistor having a first size;

a second pre-amplifier configured to amplify the difference between the input signal and the reference signal using a second transistor having a second size different from the first size; and a latch configured to generate the comparison signal using at least one of an output of the first pre-amplifier and an output of the second pre-amplifier, wherein the first pre-amplifier and the second pre-amplifier share the latch.

2. The analog-to-digital converter of claim 1, wherein the latch generates the comparison signal using a third transistor having a third size and a fourth transistor having a fourth size different from the third size.

3. The analog-to-digital converter of claim 2, wherein the latch comprises:

a first reset circuit configured to reset first and second output nodes using the third transistor;

a second reset circuit configured to reset the first and second output nodes using the fourth transistor; and an amplifier circuit configured to amplify voltage levels of the first and second output nodes using at least one of the output of the first pre-amplifier and the output of the second pre-amplifier.

4. The analog-to-digital converter of claim 3, wherein the control signal comprises:

a first control signal provided to the reference signal adjusting circuit; and a second control signal which determines whether the second reset circuit is enabled.

5. The analog-to-digital converter of claim 1, wherein the latch comprises:

a first reset circuit configured to receive the output of the first pre-amplifier and reset first and second output nodes using a third transistor having a third size;

a second reset circuit configured to receive the output of the second pre-amplifier and reset the first and second output nodes using a fourth transistor having a fourth size different from the third size; and an amplifier circuit configured to amplify voltage levels of the first and second output nodes using at least one of the output of the first pre-amplifier and the output of the second pre-amplifier.

6. The analog-to-digital converter of claim 5, wherein the control signal comprises:

a first control signal provided to the reference signal adjusting circuit; and a second control signal which determines whether the second reset circuit is enabled, wherein the second reset circuit comprises a switch which is controlled by the second control signal and connects the first output node and a ground.

7. The analog-to-digital converter of claim 5, wherein the control signal comprises:

a first control signal provided to the reference signal adjusting circuit;

a second control signal which determines whether the second reset circuit is enabled; and a third control signal which determines whether the second pre-amplifier is enabled and which is different from the second control signal.

8. The analog-to-digital converter of claim 1, wherein the comparison signal comprises:

a first comparison signal generated using the first pre-amplifier and the latch; and a second comparison signal generated using the second pre-amplifier and the latch, wherein the control logic converts an input signal into a digital signal including a first bit and a second bit, a bit value of the first bit is determined using the first comparison signal, and a bit value of the second bit is determined using the second comparison signal.

9. The analog-to-digital converter of claim 8, wherein the first comparison signal is generated prior to the second comparison signal, and the first size is smaller than the second size.

10. The analog-to-digital converter of claim 8, wherein the first comparison signal is generated prior to the second comparison signal, the first comparison signal is generated without using the second pre-amplifier, and the second comparison signal is generated using the first and second pre-amplifiers.

11. The analog-to-digital converter of claim 8, wherein the first comparison signal is generated prior to the second comparison signal, the first comparison signal is generated without using the second pre-amplifier, and the second comparison signal is generated without using the first pre-amplifier.

12. The analog-to-digital converter of claim 1, further comprising:

a sample circuit configured to receive the input signal, sample and hold the input signal, and provide the sampled input signal to the comparator, wherein the reference signal adjusting circuit adjusts a voltage level of the reference signal in accordance with the control signal.

13. The analog-to-digital converter of claim 12, wherein the analog-to-digital converter is a successive approximation register analog-to-digital converter (SAR ADC).

14. An analog-to-digital converter, comprising:

a comparator configured to compare an input signal with a reference signal, and to output a first comparison signal and a second comparison signal indicating a corresponding comparison result; and a control logic configured to determine a first bit value based on the first comparison signal, a second bit value based on the second comparison signal, and a third bit value corresponding to the input signal based on the first bit value and the second bit value, wherein the comparator comprises:

a first pre-amplifier configured to amplify a difference between the input signal and the reference signal;

a second pre-amplifier configured to amplify the difference between the input signal and the reference signal; and a latch configured to generate the first and second comparison signals using at least one of an output of the first pre-amplifier and an output of the second pre-amplifier, wherein a size of the first pre-amplifier and a size of the second pre-amplifier are different from each other, and the control logic controls the first and second pre-amplifiers such that the first comparison signal is generated using the first pre-amplifier, and the second comparison signal is generated using the second pre-amplifier.

15. The analog-to-digital converter of claim 14, wherein the first comparison signal is output prior to the second comparison signal, and the size of the first pre-amplifier is smaller than the size of the second pre-amplifier.

16. The analog-to-digital converter of claim 15, wherein the control logic controls the first and second pre-amplifiers such that the first comparison signal is generated using the first pre-amplifier without using the second pre-amplifier, and such that the second comparison signal is generated using the first and second pre-amplifiers.

17. The analog-to-digital converter of claim 15, wherein the control logic controls the first and second pre-amplifiers such that the first comparison signal is generated using the first pre-amplifier without using the second pre-amplifier, and such that the second comparison signal is generated using the second pre-amplifier without using the first pre-amplifier.

18. The analog-to-digital converter of claim 14, further comprising:
   a reference signal adjusting circuit configured to adjust the reference signal,
   wherein the control logic generates a control signal for adjusting the reference signal based on the first and second comparison signals, and provides the control signal to the reference signal adjusting circuit, and
   the reference signal adjusting circuit adjusts the reference signal based on the control signal.

19. An analog-to-digital converter, comprising:
   a comparator configured to compare an input signal with a reference signal, and to output a comparison signal indicating a corresponding comparison result;
   a control logic configured to output a control signal for adjusting the reference signal based on the comparison signal, and to determine a digital signal corresponding to the input signal based on the comparison signal; and
   a reference signal adjusting circuit configured to adjust the reference signal based on the control signal,
   wherein the comparator comprises:
   a first pre-amplifier configured to amplify a difference between the input signal and the reference signal using a first transistor having a first size;
   a second pre-amplifier configured to amplify the difference between the input signal and the reference signal using a second transistor having a second size different from the first size; and
   a latch configured to generate the comparison signal using at least one of an output of the first pre-amplifier and an output of the second pre-amplifier,
   wherein the latch comprises:
   a first reset circuit configured to receive the output of the first pre-amplifier and reset first and second output nodes using a third transistor having a third size;
   a second reset circuit configured to receive the output of the second pre-amplifier and reset the first and second output nodes using a fourth transistor having a fourth size different from the third size; and
   an amplifier circuit configured to amplify voltage levels of the first and second output nodes using at least one of the output of the first pre-amplifier and the output of the second pre-amplifier.

20. The analog-to-digital converter of claim 19, wherein the comparison signal comprises a first comparison signal and a second comparison signal, which is output later than the first comparison signal,
   the comparator outputs the first comparison signal using the first pre-amplifier, the first reset circuit, and the amplifier circuit, without using the second pre-amplifier and the second reset circuit,
   the comparator outputs the second comparison signal using the first and second pre-amplifiers, the first and second reset circuits, and the amplifier circuit,
   the first size is smaller than the second size, and
   the third size is smaller than the fourth size.

* * * * *